United States Patent [19]

Hurwitt et al.

[11] Patent Number: 4,957,605
[45] Date of Patent: Sep. 18, 1990

[54] METHOD AND APPARATUS FOR SPUTTER COATING STEPPED WAFERS

[75] Inventors: Steven D. Hurwitt, Park Ridge, N.J.; Israel Wagner, Monsey, N.Y.; Robert Hieronymi, Rock Cavern, N.Y.; Charles Van Nutt, Monroe, N.Y.

[73] Assignee: Materials Research Corporation, Orangeburg, N.Y.

[21] Appl. No.: 339,308

[22] Filed: Apr. 17, 1989

[51] Int. Cl.$^5$ .................................................. C23C 14/35
[52] U.S. Cl. .......................... 204/192.12; 204/192.13; 204/298.03; 204/298.17; 204/298.18; 204/298.19; 204/298.12; 204/298.08; 204/298.16
[58] Field of Search ................ 204/192.12, 192.13, 204/298 MT, 298 FP, 298 SG, 298 PM, 298 TS, 298 PS, 298 ME

[56] References Cited

U.S. PATENT DOCUMENTS

| | | | |
|---|---|---|---|
| 3,669,871 | 6/1972 | Elmgren et al. | 204/298 TS |
| 3,878,085 | 4/1975 | Corbani | 204/298 |
| 3,884,793 | 5/1975 | Penfold et al. | 204/298 |
| 3,956,093 | 5/1975 | Mcleod | 204/192.12 |
| 4,041,353 | 8/1977 | Penfold et al. | 315/267 |
| 4,100,055 | 7/1978 | Rainey | 204/298 |
| 4,166,018 | 8/1979 | Chapin | 204/192.12 |
| 4,166,783 | 9/1979 | Turner | 204/192.13 |
| 4,401,539 | 8/1983 | Abe et al. | 204/192.1 |
| 4,416,759 | 11/1983 | Harra | 204/298 |
| 4,444,635 | 4/1984 | Kobayashi et al. | 204/192.15 |
| 4,500,408 | 2/1985 | Boys et al. | 204/298 |
| 4,500,409 | 2/1985 | Boys et al. | 204/298 |
| 4,569,746 | 2/1986 | Hutchinson | 204/298 |
| 4,595,482 | 6/1986 | Mintz | 204/298 |
| 4,604,180 | 8/1986 | Hirukawa et al. | 204/298 |
| 4,606,806 | 8/1986 | Helmer | 204/298 |
| 4,622,121 | 11/1986 | Wegmann et al. | 204/298 |
| 4,692,230 | 9/1987 | Nihei et al. | 204/192.31 |
| 4,724,060 | 2/1988 | Sakata et al. | 204/298 |
| 4,734,183 | 3/1988 | Wirz et al. | 204/298 |
| 4,747,926 | 3/1988 | Shimizu et al. | 204/298 |
| 4,761,218 | 8/1988 | Boys | 204/298 |
| 4,810,335 | 3/1989 | Hieber | 204/192.33 |
| 4,810,346 | 3/1989 | Wolf et al. | 204/298 |
| 4,834,860 | 5/1989 | Demaray et al. | 204/298 SG |
| 4,842,703 | 6/1989 | Class et al. | 204/192.12 |
| 4,853,102 | 8/1989 | Tateishi et al. | 204/298 |
| 4,855,033 | 8/1989 | Hurwitt | 204/298 TS |

FOREIGN PATENT DOCUMENTS 62-211373 9/1987 Japan ............................. 204/298 TS

OTHER PUBLICATIONS

*Research/Development*, Feb. 1971, pp. 41–44.

*Primary Examiner*—Aaron Weisstuch
*Attorney, Agent, or Firm*—Wood, Herron & Evans

[57] ABSTRACT

A magnetron sputtering method and apparatus employing a one-piece annular target having a concave continuously smooth surface with an inwardly facing portion close to and surrounding the outer edge of a stepped wafer provides a sputtering surface with areas facing the differently facing surfaces of the wafer steps. Two concentric erosion zones on the target surface are independently energized at different electrical parameter values by synchronizing the power applied to the single target with switched activation of plasmas overlying the respective target regions which define the erosion zones. The electrical parameters and the geometry are established so as to uniformly coat the differently facing surfaces of the stepped wafer. During part of the duty cycle during which each target region is energized, parameters may be measured. Such parameters may be those which vary with changes in geometry as for example may be due to target erosion. The operation of different target regions, such as the duty cycles or power levels for such regions, may be separately varied in response to the measurements or otherwise, to maintain uniform substrate coating as the target erodes. The target is thicker under the outer region and has an annular pole piece embedded to reduce the space separating the target erosion regions, and includes means to cool the target and reinforce it against thermal expansion.

120 Claims, 7 Drawing Sheets

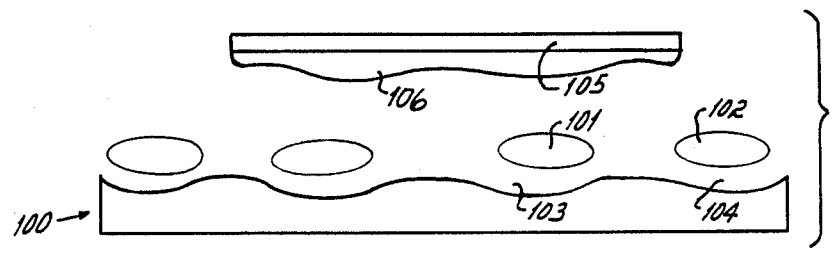
PRIOR ART
FIG. 9A
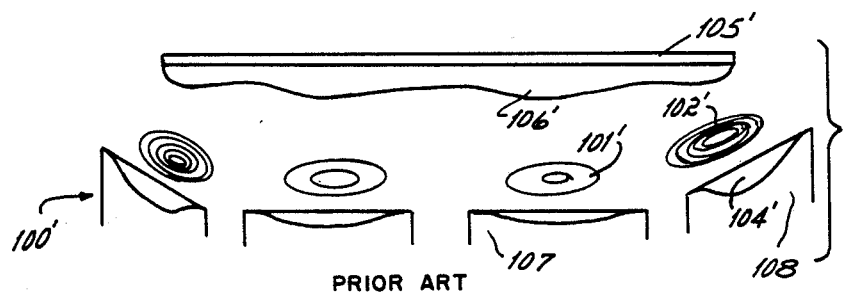
PRIOR ART
FIG. 9B
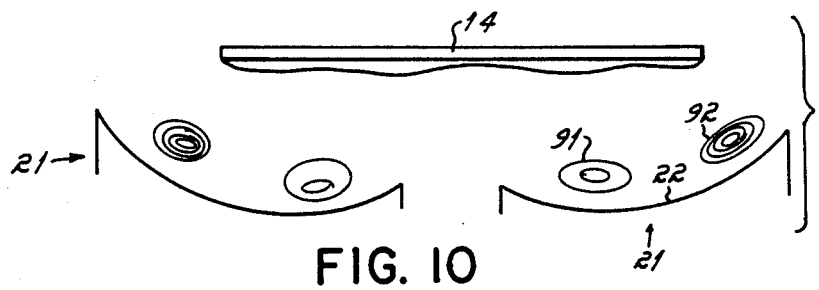
FIG. 10
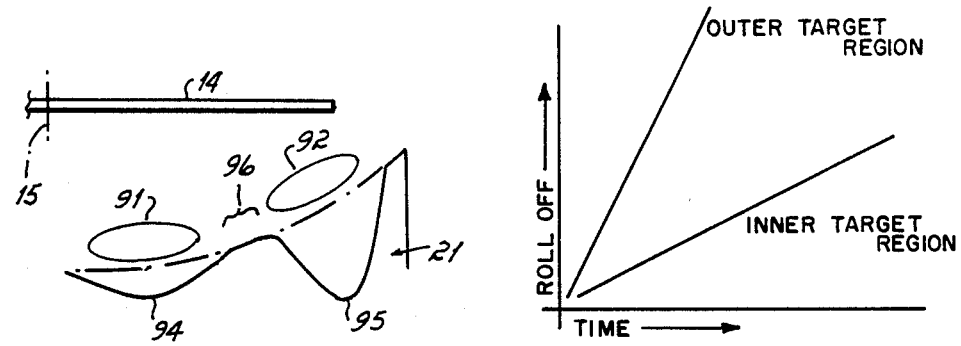
FIG. 14
FIG. 15

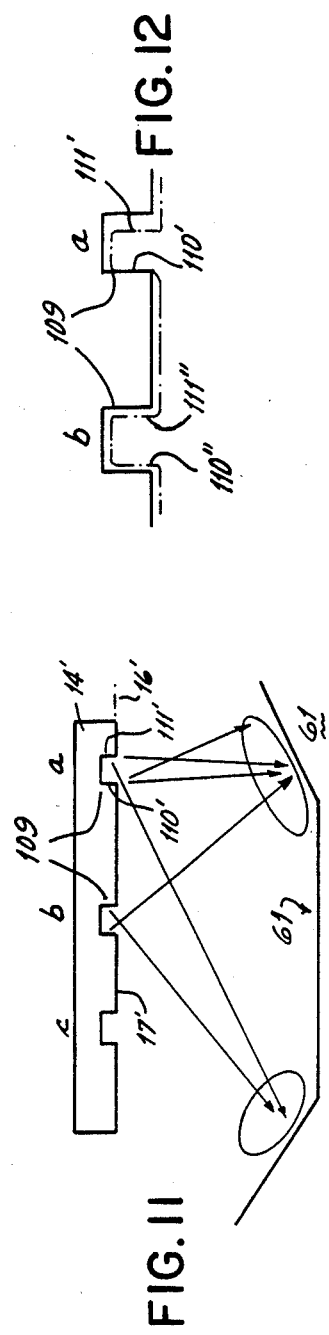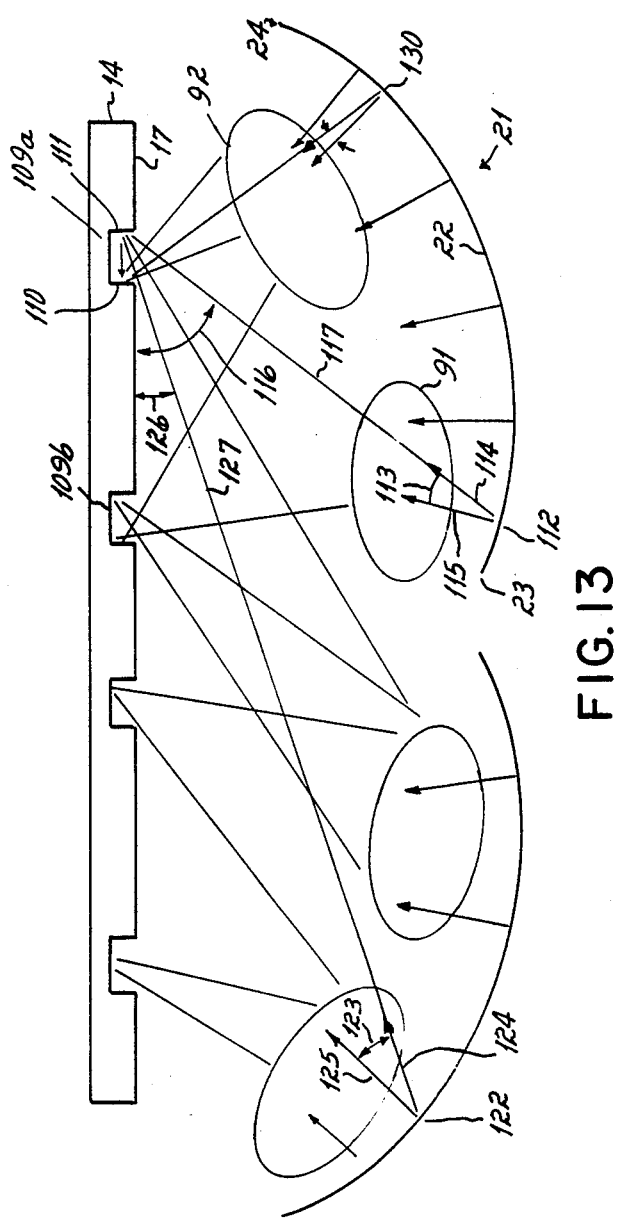

METHOD AND APPARATUS FOR SPUTTER COATING STEPPED WAFERS

FIELD OF THE INVENTION

The present invention relates to the sputter coating of substrate surfaces and, more particularly, to a method and apparatus for distributing coating material sputtered from a magnetron sputtering target uniformly on the stepped or unstepped surfaces of semiconductor wafers.

BACKGROUND OF THE INVENTION

Sputter coating involves the process of ionically bombarding the surface of a target of sputtering material to eject from it particles of atomic dimension which redeposit onto the surface of a substrate as a thin film. The process is carried out in a vacuum chamber utilizing a neutral gas such as argon for the source of ions. Ionization is achieved by biasing the target with a negative potential to cause electrons to be released from the target and to move toward an anode. In the course of this motion, the electrons collide with and ionize atoms of the gas above the target surface. The positive ions thus formed are attracted toward the target surface by its negative charge and, upon impact, transfer momentum to the target surface and eject atoms or small particles of coating material from the target. The ejected atoms move from their points of emission on the target surface and strike and adhere to the portions of the substrate surfaces in their paths.

Magnetron sputtering is an enhanced sputtering method in which a magnetic field is formed over the target surface. The field deflects electrons emitted from the target so that they move in confined paths and are thus trapped in confined spaces above the target surface. The confinement of electrons greatly increases their density and the likelihood that collisions of electrons with atoms of the gas in the space near the target surface will occur, thus increasing the useful production of ions. The concentration of ions so produced is manifested in the form of a glowing plasma in the confined space above the target surface and results in a higher rate of ion bombardment of the region of the target surface adjacent the plasma This causes an increased emission rate of sputtering material and thus a more rapid erosion of the target surface adjacent the plasma.

A main problem in the sputtering technology of the prior art has been in achieving uniformity of the coating applied to the substrate surface. The substrates are often wafers which are to be coated with conductive material to form electronic circuits. Prior to the performance of the sputter coating process, wafers are frequently processed by other coating or etching processes to prepare them for the deposition of multiple circuit layers. These processes result in the formation of linear grooves in the surface layers or in holes (called "vias") therethrough, the vertical sides of which are perpendicular to the planar surface of the wafer. In the sputter coating process, these sides or "steps" must also be coated to provide for electrical conduction between various conductive circuit layers joined by the stepped surfaces. As a result, the problem of uniformly coating the wafer is complicated by the need to uniformly coat mutually perpendicular and differently facing portions of the wafer surfaces in the sputtering process.

The sputter coating devices of the prior art have encountered different types of problems in providing the desired distribution of the coating applied to the substrates Some proposed solutions to certain problems have aggravated other problems.

Planar targets have been employed with plasmas confined by magnetic fields over the target area. See U.S. Pat. Nos. 3,878,085 and 4,166,018. Attempts to smooth the erosion of the target have been frequently made in the prior art. Moving magnetic fields have been employed for this purpose, and this has been attempted by both mechanically moving magnet elements and by electrically moving magnetic fields by changing magnet currents. See U.S. Pat. Nos. 3,956,093 and 4,401,539, and Japanese Publication No. 58-71569.

Some prior art devices have made efforts to spacially adjust the flux of a sputtered coating material to compensate to some degree for non-uniformity of coverage of the substrate which would otherwise occur. Such a technique is shown in U.S. Pat. No. 4,747,926, for example. This effort has led in the prior art to the provision of separate isolated targets with separately regulated power supplies. Such targets, such as those shown in U.S. Pat. Nos. 4,606,806 and 4,595,482, may utilize a planar target surrounded by an annular frustoconical target electrically isolated from the planar target. When using separately isolated targets, each target may have a magnetic field over its surface and a plasma which is separate and distinct from that affecting the other target surface. A separate power source may be used to independently energize each target part, as shown in U.S. Pat. No. 4,595,482.

Plural targets, however, require multiple power components and duplicative circuitry and controls for each of the target cathode power supplies and for each of the magnetic field generating current power supplies. From a mechanical point of view, these plural targets also require separate seals to maintain the vacuum in the chamber, require separate installation and alignment procedures, require separate manufacturing steps, and require separate means to insure that the targets are properly cooled. All of these requirements result in generally greater cost, increased manufacturing and maintenance problems, and greater complexity in the preparation and operation of the machines One piece targets of the prior art have not been amenable to regulation of the sputtering intensity from different regions on the sputtering surface. Lack of an ability to effectively control emissions from separate target regions has been a disadvantage of one piece targets of the prior art, thus motivating the development of multiple target assemblies with their inherent disadvantages.

Prior art developments directed at single targets or at individual target components of target assemblies have concentrated on preventing non-uniform erosion, as discussed in U.S. Pat. No. 4,401,539. Target surfaces often exhibit undesirable erosion patterns which alter the target surface geometry causing a departure from the initial emission pattern of the target. Consequently, the deposition distribution on the substrate also changes as the target erodes. Furthermore, the variation of the emission strength and across the target surface and the resulting variation in deposition uniformity across the substrate continue to change with time. Thus, irregular erosion has been regarded in the prior art, for example, in U.S. Pat. No. 4,100,055, as a phenomenon to be prevented. Reconfiguration of magnet poles or moving of pole pieces has been employed to smooth target erosion, for example, as shown in U.S. Pat. No. 4,622,121. In the prior art, non-uniform erosion of single targets has been regarded as resulting in an inefficient use of target material due to the non-uniform consumption of the target across its surface.

Erosion also results in a change, generally a decrease, in the sputtering rate as the target erodes. With non-uniform target erosion this decrease occurs non-uniformly across the sputtering surface and results in a time varying change in the distribution of sputtering power on the target surface and a resulting change in the total amount and the distribution of coating material onto the substrate. With separate electrically isolated targets, these effects can be measured and compensation made through control of electrical parameters. But with single targets or target components, such effects occur in a way which heretofore could not be measured or controlled during the course of the sputtering process. Visual inspection of the target and adjustment of electrical parameters of the target based on experience in observing the target erosion was the only course which the prior art employed. For example, U.S. Pat. No. 4,166,783 relates to one attempt at such control. Accordingly, the goal of intentionally causing non-uniform emission rates from target surfaces was primarily restricted to the use of multi-part targets, and was inconsistent with the goal of controlling erosion patterns on a one piece target. Non-uniform emission patterns necessarily produce non-uniform target erosion.

The need to uniformly coat substrates having steps and vias with sides perpendicular to the substrate wafer plane has been inadequately dealt with in the prior art. Non-uniform target emission rates and target erosion control remain problems in the prior art, particularly for one piece targets.

Accordingly, there is a need for providing, maintaining and controlling magnetron sputtering targets for uniformly coating substrate wafers with steps. Furthermore, there is a more specific need to utilize heretofore incompatible features to solve the problems of the prior art discussed above, particularly in a one-piece sputtering target.

SUMMARY OF THE INVENTION

It is a primary objective of the present invention to improve the step coverage uniformity of sputter coating deposition upon a substrate wafer, particularly with respect to step surfaces generally perpendicular to the substrate wafer which face in different directions from each other, and are located on different areas of the wafer. More particularly, it is an objective of the present invention to provide a method and apparatus for depositing a more uniform sputter coating across a wafer substrate, particularly a substrate having steps formed by adjacent planar and perpendicular wafer surface areas.

It is an additional objective of the present invention to minimize the adverse time varying effects on uniform step coverage due to geometric changes in the target surface caused by the progressive erosion of the target.

Accomplishment of the objectives of the present invention is based in part upon consideration of the theory that the buildup of sputter coating at any point on a wafer surface is the function of many parameters, including the geometry defining the shape and relative spacing of the target and of the substrate, and those which shape and energize the electromagnetic fields which influence the sputtering of the target.

Particularly, it has been considered that the point to point geometry between each of the surface increments of the target emission surface and each of the increments of the substrate surface upon which emitted sputtering material is deposited influence the transfer rate between the two increments. The path distances as well as the angles which the increments form with the paths of the particles are geometric parameters influencing the sputtering transfer rates between each pair of increments.

In addition, the shapes and strengths of the magnetic fields which concentrate the plasma over the target, the electric fields and potentials between the target and the substrate, and the currents, voltages and impedances in the circuit through the target and substrate, are considered as parameters which affect the distribution of the coating over the substrate. The effects which these parameters have upon the paths and motion of ions and electrons in the space between the target and the substrate, and consequently upon emission and deposition patterns of the sputtered particles produced, have been only partially controlled by the prior art and inadequately managed to enhance coating uniformity.

These geometric and electric parameters have, in approaching the present invention, been considered to also affect the erosion pattern of the target. Because the particles or atoms sputtered from the target are heavy and usually neutral in charge, they are considered to propagate from the point of emission on the target to their destination on the substrate or elsewhere. Thus, the erosion pattern of the target, including the target geometry in relation to the substrate, is found to strongly correlate with the distribution of the sputtering material deposited on the substrate.

In approaching the objectives of the present invention, it has been considered that increasing the strength of one magnetic field increases the density of trapped electrons in plasma adjacent one of the target regions. These increases increase the ion flux onto the target surface at the region near the strengthened field. The increased flux is usually manifested in part in the form of a decreased electrical impedance between the particular target region and the circuit anode and increases the number of coating atoms emitted from that region of the target. This increases the erosion rate of the target in that region, which in turn increases the deposition rate on the substrate surface areas predominantly supplied by that target region. The increased deposition is most pronounced on substrate faces more directly facing or nearer to this target region.

According to principles of the present invention, the objectives are in part accomplished by providing a one-piece target having a concave, annular sputtering surface with separately energized multiple erosion regions. The concave target surface includes areas which approximately face the differently facing step surfaces of the substrate. Preferably, the annular target surface is smooth and continuous at every increment. Multiple and preferably concentric erosion zones on the target surface are separately controlled with plasma supporting magnetic fields which are preferably switched with the energization of the target.

According to further principles of the present invention, the objectives are further accomplished in part by separately controlling the electrical parameters of different regions of the sputtering target. The parameters are controlled so that the sputtering energy of each target region results in the emission of the sputtered material which is uniform. This is preferably done by alternately energizing the separate target regions. In the preferred embodiment, electromagnet currents are switched on and off to alternately activate the plasma supporting magnetic fields over the separate target regions while the power level at which the target is energized is switched in synchronism with the switching of the magnets. Preferably, the duty cycle of this switching sequence is controlled to vary the sputtering amount from the different target surface regions, but cathode power or other electrical parameters can similarly be controlled. The control may be in response to measurement of erosion. The measurement is, according to certain embodiments of the invention, achieved by direct measurement of the eroding surface, such as by laser device, by deposition rate monitoring, or by detecting or regulating an electrical parameter such as cathode power which, because the switching localizes power consumption to the energized target region, is related to only a certain region of the target.

According to certain other principles of the present invention, magnetic pole pieces which underlie the target are made to extend into the target region to bring their magnetic pole ends near the sputtering surface of the target, reducing the width of the non-erosion zone overlying the pole piece and thereby increasing the efficiency of the use of target material. These embedded pole pieces serve to structurally reinforce the target and its mounting device against radial outward thermal expansion thereby reducing the likelihood of unwanted thermal deformation. The embedded pole piece structure is a means for introducing additional cooling into the target volume which has a tendency to heat up when bombarded with ions.

Advantages of the present invention, and particularly the preferred embodiment of the invention, are that a one piece annular concave target can be employed in which the surface can be formed by a simple machining step, such as, for example, may be performed on a lathe. It can thus be more easily fabricated than can a multi-part target having complex geometries. The one piece structure is far easier to seal with the sputtering chamber, easier to align and adjust, easier to change, and easier to cool. The infinite angles of the surface present better proximity and sputtering angles for the differently facing surfaces of stepped wafers. The separate control of the separate erosion regions allows the use of non-uniform target erosion in order to enhance uniform step coverage. By switching the activating plasmas in synchronism with the energization of the target, a single power supply can be used for two or more target regions, and makes possible the separate control of different sputtering areas of the same target surface.

The present invention has the further advantages of providing for localized control of the sputtering amounts from specific known regions of a one-piece target, and thus for localized control of the erosion of the target and control of the resulting deposition distribution uniformity across the substrate surface. Accordingly, uniform step coverage provided by initially selecting the geometric parameters of the target in accordance with the present invention, and the electrical parameters in energizing the target initially, can be maintained notwithstanding the time varying shape of the target as the target erodes. With features of the present invention, it is possible to determine and differently regulate parameters of two or more regions of a one piece target for use in controlling the target performance or condition region by region.

Thus, advantages heretofore available only in one piece targets and others available in only two part isolated targets, as well as additional advantages, are provided, according to the principles of the present invention, in a single target assembly.

These and other objectives and advantages of the present invention will be readily apparent from the following detailed description of the drawings in which:

BRIEF DESCRIPTION OF THE DRAWINGS

FIG. 9A is a diagram of a substrate deposition pattern typical of a planar target of the prior art; while FIG. 9B is a diagram similar in format to FIG. 9A illustrating a typical two part target of the prior art.

FIG. 10 is a diagram of the present invention, similar in format to FIG. 9A and 9B, but illustrating further principles of the present invention in a one piece target.

FIG. 11 is a diagram illustrating certain phenomena which effect the coating thickness for step coverage of a wafer illustrated in the context of targets with the features shown in FIG. 3.

FIG. 12 is a diagram illustrating the step coverage distribution for the configuration of FIG. 11.

FIG. 13 is a diagram illustrating certain principles affecting the distribution of coating material in step coverage on a substrate, and illustrated in connection with a target design of FIG. 1 according to principles of the present invention.

FIG. 14 is a diagram of target erosion patterns for multiple regions of the target of FIG. 13.

FIG. 15 is a graph illustrating erosion rolloff of the target emissions for different regions of a sputtering target as a function of time.

DETAILED DESCRIPTION OF THE DRAWINGS

Magnetron sputtering devices of the type to which the present invention relates are described in the following commonly assigned and copending patent applications which are hereby expressly incorporated in their entirety into this application by reference:

Pending patent application "Cathode Target Design for a Sputter Coating Apparatus," Ser. No. 095,100, filed Sept. 10, 1987, now U.S. Pat. No. 4,855,033, which is a continuation of application Ser. No. 848,698, filed Aug. 4, 1986 and now abandoned; pending patent application entitled "Apparatus for Improving the Uniformity of Ion Bombardment In a Magnetron Sputtering System", Ser. No. 095,560, filed Sept. 10, 1987, now U.S. Pat. No. 4,871,933, which is a continuation of application Ser. No. 848,750, filed Apr. 4, 1986 and now abandoned; and pending applications entitled "Method and Apparatus for Handling and Processing Wafer-Like Articles", one being Ser. No. 222,327, filed July 20, 1988, now U.S. Pat. No. 4,909,695, which is a continuation of application Ser. No. 112,766, filed Oct. 22, 1987, now abandoned, which is a continuation of application Ser. No. 848,687, filed Apr. 4, 1986 and now abandoned, and the other being application Ser. No. 222,328, filed July 20, 1988, now U.S. Pat. No. 4,915,564, which is a continuation of application Ser. No. 112,777, filed Oct. 22, 1987 now abandoned which is a continuation of application Ser. No. 848,297, filed Apr. 4, 1986 and now abandoned.

Figure 1:
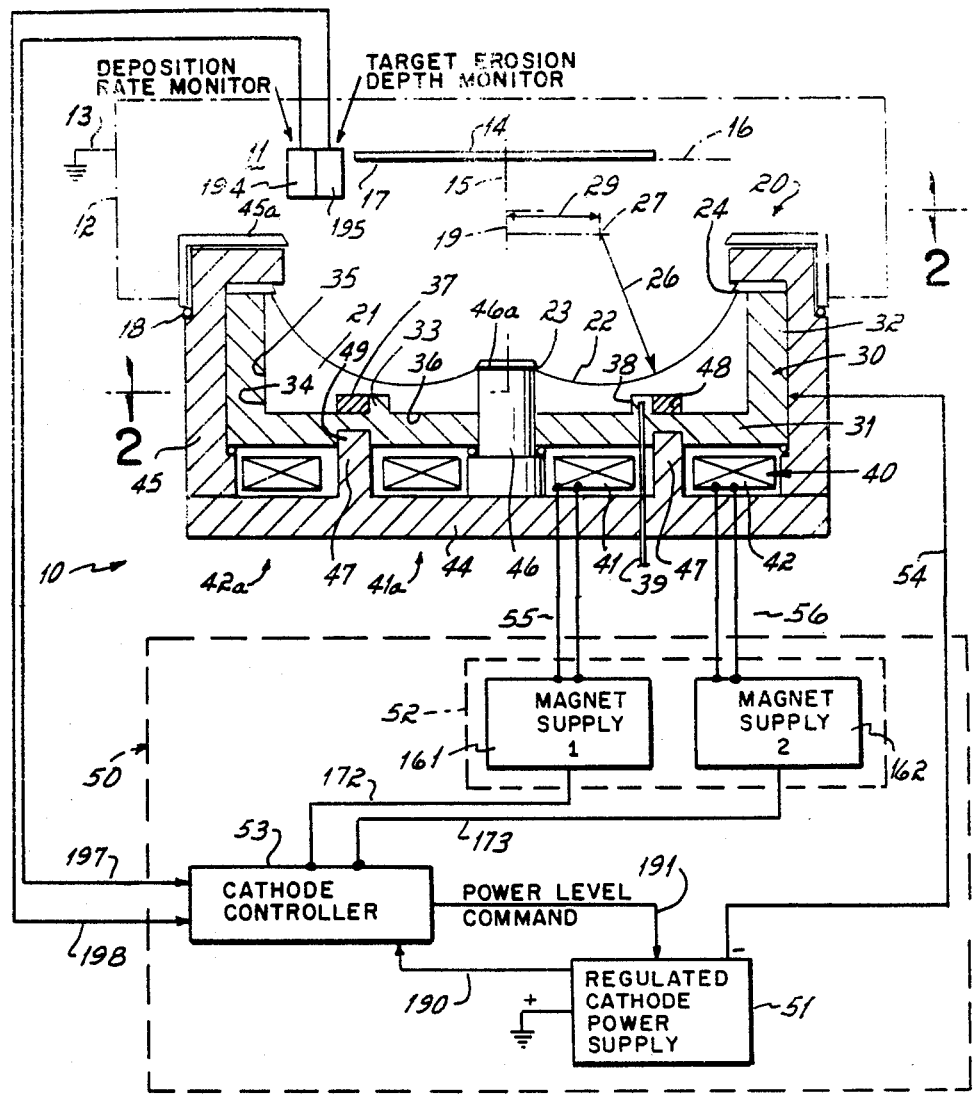
FIG. 1 is a schematic diagram of a sputtering system embodying principles of the present invention, which includes a cross-section axially through a sputtering cathode target and a schematic block and logic diagram of the control circuitry therefor.

Referring to FIG. 1, a magnetron sputtering apparatus 10 according to the principles of the present invention is diagrammatically illustrated. The apparatus 10 comprises a vacuum chamber 11 bounded by a chamber wall 12 connected to an electrical ground at 13. Within the chamber 11 is a support (not shown) on which is mounted a workpiece 14. The workpiece 14 is typically a silicon wafer substrate on which a conductive coating is to be deposited by a sputtering process performed with the apparatus 10. The substrate 14 is usually a planar or patterned wafer, often circular in shape, as shown on edge in FIG. 1 in connection with the preferred embodiment of the present invention. The wafer 14 has a geometric center as defined by a central axis 15 perpendicular to the plane 16 of the wafer substrate 14. The substrate 14 has a surface 17 parallel to the plane 16 of the wafer 14 and oriented to receive a sputter coating deposition from sputtering source.

Positioned in sealing relationship with the chamber wall 12, as maintained by an O-ring seal 18, is a cathode target assembly 20 which provides the source of sputtering material for sputter coating the wafer 14. The target assembly 20 when positioned in the chamber wall 12 is, in the illustrated embodiment, also generally circular and has an axis 19 coextensive with the axis 15 of the wafer 14. The target assembly 20 includes a sputtering target 21 formed of the material to be sputtered upon the surface 17 of the substrate 14.

Figure 2:
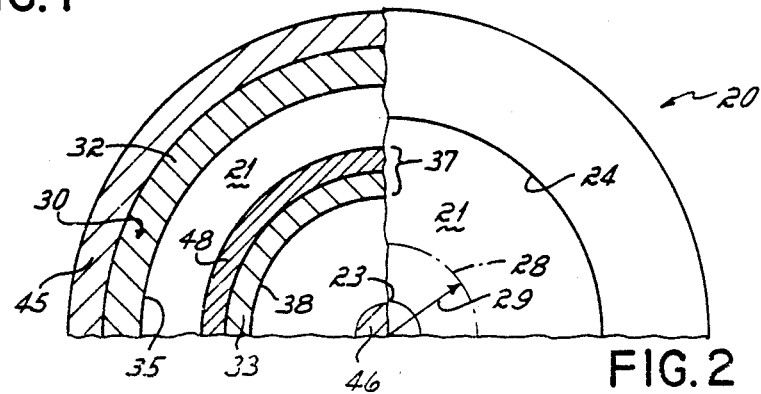
FIG. 2 is a transverse view of the sputtering target of FIG. 1, partially broken away, and partly in cross-section, taken along line 2—2 of FIG. 1.

As can be better seen by referring concurrently to FIGS. 1 and 2, the target 21 is annular in shape with its axis 19 in common with the central axis 15 of the substrate 14. The target 21 has a sputtering surface 22 bounded by a circular inner rim 23 and a circular outer rim 24. The surface 22 is smooth and continuous from the inner rim 23 to the outer rim 24. By "smooth and continuous" is meant that the surface 22 of the target 21 is, at every point between the rims 23 and 24, of continuously varying slope, having no angles or points at which the slope is not mathematically defined.

Preferably, the curvature of the surface 22 is concave at every increment. In the embodiment illustrated, the surface 22 represents a figure of rotation about axis 19 of a circle of radius 26 whose origin is located at a point 27 spaced a distance 29 from axis 19 and a circle 28. In other embodiments, distance 29, point 27 and radius 26 may be variable rather than fixed for different distances on the surface 22 from axis 19, and may be related to parabolic, elliptical or other mathematical functions or combinations or multiples thereof. In one preferred embodiment, the figure of rotation is a modified ellipse in which the surface at distances near the inner rim 23, the outer rim 24 and a point intermediate the inner and outer rims are of three different radiuses about three different points.

The outer rim 24 of the target 21 is, for purposes which will be discussed in more detail below, of greater diameter than that of the wafer 14. Preferably, for wafers of diameter up to eight inches, a target diameter of approximately eleven inches is preferred. The outer rim 24 is the part on the target 21 which is in closest proximity to the plane 16 of the wafer 14. With the diameter of the wafer 14 of approximately four to eight inches and the diameter of the target 21 of approximately six to eleven inches, the spacing of the outer rim 24 of the target 21 from the plane 16 of the wafer 14 is preferably approximately one inch.

It will be appreciated, therefore, that the preferred geometry results in a target surface 22 which is farthest from the plane 16 of the substrate 14 at a radius 29 from the axis 19, is closer to the plane 16 of the substrate 14 at its center rim 23, and is closest to the plane 16 of the substrate 14 at the outer rim 24 of the target 21. The target surface 22 nonetheless presents a generally overall concave surface across the extent of the target 21 from outer rim 24 to outer rim. The target 21 so configured is preferably formed of a single piece of sputtering material, and may be formed by cutting or machining upon a lathe.

The target 21 is supported in a target holder 30 having a generally circular back plate 31 concentric with the axis 19. The target holder 30 has an outer cylindrical wall 32 and an upstanding cylindrical midwall 33. The outer wall 32 surrounds the outer rim 24 of the target 2!. The holder 30 has an inner surface 34 which bounds the back plate 31, outer wall 32 and midwall 33 to support and conduct heat from the target 21. The target 21 has an outer cooling surface 35 which, when the target 21 is mounted in holder 30, conforms to and lies in close cooling contact with the inner surface 34 of the holder 30. The target 21 also has a back 36 on the cooling surface 35 which lies in contact with the inner surface 34 of the back plate portion 31 of the target holder 30. In the back 36 of the target 21 is an annular groove 37 having an inner surface 38 which lies in partial contact with the midwall 33 of the holder 30. As such, all surfaces of the target 21 are capable of being turned on a lathe.

The target holder 30 is made of a heat conductive material, usually copper, and is also usually provided with a tube or other such means 39 for communicating with the cooling liquid to maintain the holder 30 at a lowered temperature, and to thereby withdraw heat from the target 21 which is generated during sputtering by gas ion bombardment. Such means are shown only diagrammatically but are employed in many different forms in sputtering devices.

The target assembly 20 is provided with a magnet assembly 40 which preferably includes a pair of electromagnets 41a and 42a having annular inner and outer windings 41 and 42, respectively, lying concentrically in a plane behind the target holder 30 and centered about and perpendicular to the axis 19 as shown in FIG. 1. For some applications, permanent magnets may be employed or a combination of permanent magnets and electromagnets. A rigid ferromagnetic material forms the structural support for target assembly 20 and constitutes the magnetic pole pieces which form the magnets 41a and 42a when current is applied to the windings 41 and 42. This ferromagnetic material includes a circular cap piece 44 which forms the planar rear support of the assembly 20 and sustains the transverse magnetic field between pole pieces of the magnets 41a and 42a. A cylindrical outer pole piece 45 surrounds the outer wall 32 of the holder 30. The upper exposed surface is covered by a shield 45a referred to as the dark space shield which prevents sputtering of the pole piece surface. An inner cylindrical pole piece 46 having as its axis the axis 19 projects through the inner rim 23 of the target 21. This pole piece 46 is also covered by a shield or cap 46a. A cylindrical middle pole piece 47 also having as its axis the axis 19 underlies the annular groove 37 in the target 21. A ring 48 of rigid ferromagnetic material and having the same diameter as that of the middle pole piece 47 lies and is embedded within the annular groove 37 in the back surface 36 of the target 21. The middle pole piece 47 has an upper end which is also embedded in an annular groove 49 in the surface of the backplate 31 which is opposite the midwall 33. The ferromagnetic ring 48 surrounds the midwall 33 of the holder 30 and with it fills the groove 37 in the back 36 of the target 21.

The middle pole piece 47 together with the ring 48 form a pole piece which the inner and outer magnets 41a and 42a have in common. The ring 48 is magnetically coupled to the middle pole piece 47 so as to extend the effective pole piece at the annular groove 37 of the target 21 to very near, but beneath, the surface 22 of the target 21. In that the ferromagnetic ring 48 is of a rigid ferromagnetic material, it is substantially stronger structurally than the soft copper of the holder 30. As such, it serves to structurally reinforce the midwall 33 of the target holder 30 against radial expansion caused by the heating and radial expansion of the target 21, thereby also restraining the target 21 against radial thermal expansion.

The wall 12 of chamber 11 is maintained electrically at ground potential through a system ground connection 13. The wafer 14 is connected so as to be maintained at or near ground potential or intentionally biased to be substantially negative relative to ground. An electrical power and control circuit 50 is provided to apply a negative potential to the target 21 and to energize the magnets 41a and 42a. The circuit 50 includes a target power supply 51 for energizing the target 21 by supplying sputtering power to the target 21, one or more magnet power supplies 52 for activating the magnet windings 41 and 42 by supplying current to them, and control circuitry 53 for controlling the operation of the power supplies 51 and 52. The circuit 50 has a ground connected to the system ground connection 13 and establishes the anode ground potential of the chamber wall 12. The target 21 is energized at a negative potential relative to the ground connection 13 through an output conductor 54 of the cathode power supply circuit 51. The magnet power supply circuit 52 delivers current to the windings of electromagnets 41 and 4 through outputs 55 and 56 connected to the respective magnet windings. The components of the circuit 50 and the operation which it controls are set forth in more detail below.

Figure 3:
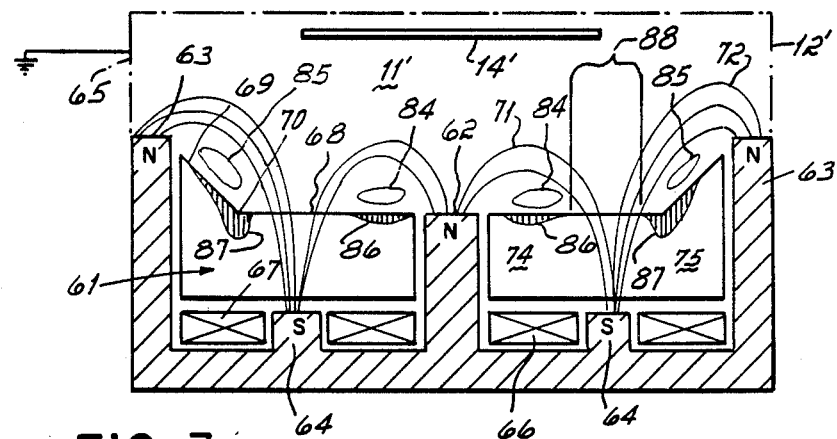
FIG. 3 is a simplified diagram of cathode sputtering target assembly illustrating the flux lines of the magnetic field, the plasma regions and the erosion zones of a target having some features of the present invention but with certain other features of the invention omitted.
Figure 4:
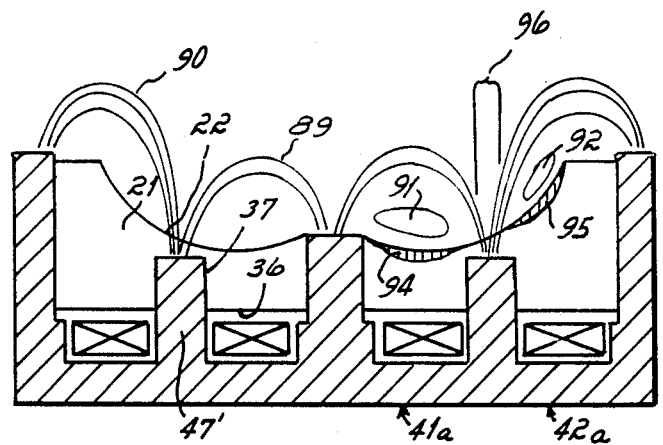
FIG. 4 is a simplified diagram of the present invention, similar in format to FIG. 3, but illustrating a target embodying principles of the preferred embodiment of the present invention of FIG. 1.

The relationship of the magnets 41a and 42a and the magnetic poles 45, 46 and 47 to the erosion of the target 21 during the sputtering process, according to the principles of the present invention, will be best understood by reference to FIG. 4. To aid in this understanding, however, an alternative will be first described in connection with FIG. 3 which shows a target assembly with certain features of the preferred embodiment of the invention omitted.

Referring to FIG. 3, an annular one piece target 61, supported in a holder (not shown), surrounds a central magnet pole piece 62, is surrounded by an annular pole piece 63, and overlies an intermediate annular pole piece 64. The magnetism of the pole pieces 62, 63 and 64 is maintained either by permanent magnets or, as in the device illustrated in FIG. 3, by a pair of electromagnet windings including an inner winding 66 and an outer winding 67 energized in such a way that direct currents flow about the center pole piece 62 in opposite directions. An annular one piece target 61 includes an inner planar surface 68 surrounded by an outer frusto-conical surface 69 which intersect at a circle 70 (a point in the cross section of FIG. 3) to form an obtuse angle between the surfaces 68 and 69.

In the target of FIG. 3 a negative voltage is applied to the cathode target 61, causing electrons to be emitted from target 61 and to travel toward a grounded anode wall 12', which is usually the wall of a vacuum chamber 11'. The chamber 11' is maintained at vacuum and contains an inert gas, usually argon. Electrons emitted from the cathode 61 collide with the argon atoms, cause the release of secondary electrons which also move toward the anode wall 12' and also collide with other argon atoms in their paths. The collisions, by stripping electrons from argon atoms, produce positive argon ions in the process. These argon ions then are attracted toward the negatively charged cathode target 61, bombard the surfaces 68 and 69 of the target 61 and cause the emission of particles or atoms of cathode material therefrom. The particles sputtered from cathode target proceed to travel from the emitting surfaces of the target 61, many to impinge upon a substrate 14' to coat the substrate with the target material.

The proper introduction of magnetic fields into the process of FIG. 3 creates what is defined as magnetron sputtering. Magnetic lines of flux 71 and 72 are produced between the opposing pole piece pair 62 and 64 and pair 63 and 64, and span, and in the illustrated case encircle, regions 74 and 75 on the respective surfaces 68 and 69 of the target 61. The lines of flux 71 between the central pole piece 62 and the intermediate pole piece 64 enclose the inner region 74 of the target 61 while the lines of flux 72 between the outer pole piece 63 and the intermediate pole piece 64 enclose the outer region 75 of the target 61. The magnetic fields 71 and 72 exert a transverse force on the charged particles moving through the fields overlying these regions 74 and 75 of the target 61. The lightweight electrons having a low inertia with respect to the forces produced as they move through the magnetic fields are deflected and caused to move in circular or spiral paths around the magnetically encircled space immediately above the respective target regions 74 and 75. The encircling electrons thus become trapped, increasing the probability of a collision of each with a gas atom and greatly increasing the number of collisions between electrons and argon atoms, and thus enhancing the production of argon ions above these regions 74 and 75 of the target 61. This ion concentration causes the gas to glow adjacent the regions 74 and 75 and this glow is visible as a pair of glowing annular clouds or plasmas 84 and 85, respectively, adjacent the target regions 74 and 75, respectively.

The use of magnetron sputtering increases the sputtering rate. It results in increased emission of particles or atoms of target material. This emission is also, however, localized in the target regions 74 and 75 due to the localized nature of the plasmas 84 and 85. By concentrating the production of gas ions in the spaces occupied by the plasmas, irregular erosion patterns 86 and 87, respectively, occur in the target regions lying inside and outside of the pole piece 64. However, where the magnetic lines of flux 71 and 72 are perpendicular to the surface of the target 61, emitted electrons move parallel to the magnetic lines of force and are not deflected. Accordingly, electrons are not trapped in the region over the pole piece 64, little plasma is formed in this region, fewer ions bombard the surface there, and the rate of erosion is not accelerated there by the magnetron sputtering processes. Therefore, a wide uneroded or minimally eroded region 88 is developed on the target 61 immediately above the pole piece 64. This region 88 is a ring which surrounds the pole piece 62 between the regions 86 and 87 and overlies the pole piece 64 on the surface of the target 61. Such a wide uneroded band results in an inefficient use of the target material.

In accordance with one preferred embodiment of the present invention, as illustrated in FIG. 4, the foregoing problem is reduced by embedding the intermediate pole piece 47, into the rear face 36 of the cathode target 21 by means of annular groove 37. The proximity of the pole piece 47' to the surface 22 of the target 21 has two effects which enhance the efficient use of target material. First, the proximity of the remote end of the magnetic pole piece 47' to the surface 22 of target 21 narrows the region over pole piece 47' at which magnetic fields 89 and 90 are generally normal to the target surface 22. Thus, there is only a small region of the target surface over which the magnetic field parallel to the target surface is insufficiently strong to support inner and outer plasmas 91 and 92. Accordingly, the inner and outer regions 94 and 95 of the target 51, respectively, are closer together, and thus the uneroded region 96 is significantly narrower than the corresponding region 88 of FIG. 3. Furthermore, the notch or groove 37 displaces a volume of the target material, so that the material which would normally be present underlying the uneroded region 96, but not used in the sputtering process, is omitted from the target 21, providing a cost savings.

Furthermore, in FIG. 3, the one-piece annular target 61 is configured with a plurality of surface segments such as 68 and 69. These surfaces join, as at the circular line 70, to form an angular juncture in the cross-sectional view of FIG. 3. It has been found that target surfaces near such angular junctures tend to erode more rapidly than smooth regions of the surfaces, and that they form deep cusps as shown in FIG. 5C. In the preferred embodiment of the present invention, a smooth surface of continuously changing slope, preferably of constant curvature with a modified elliptical cross-section, or of a circular cross-section 22 as shown in FIG. 4, avoids these angular junctures, thus avoiding the deep cusp formation which is shown in progressive stages of erosion in FIGS. 5A–5C.

Figure 5A:
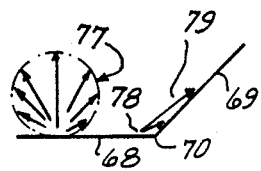
FIGS. 5A, 5B and 5C are diagrams illustrating progressive erosion patterns experienced by certain target designs of targets of the prior art.

Referring to FIG. 5A, the juncture 70, of the surfaces 81 and 82, as found in certain prior art targets is illustrated. The plasma 85 overlies this surface 69 and becomes the primary source of ions which bombard the surface 61. As these ions strike the target 61 near the juncture 70 of the surfaces 68 and 69, particles or atoms of target material are emitted at rates which vary as a function of the emission angle with the distribution which follows approximately the law of cosines, as illustrated by the distribution pattern 77 in FIG. 5A. As such, more particles are sputtered normal to the surface than at any other angle, and the average angle of emission from each surface increment is perpendicular to the surface. Nonetheless, a predictable percentage of the emitted atoms are emitted at angles acute to the surface. This is shown in the emission pattern 77, where the lengths of the arrows represent the approximate relative emission rate in the respective directions.

Figure 5B:
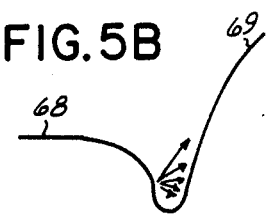
Figure 5C:
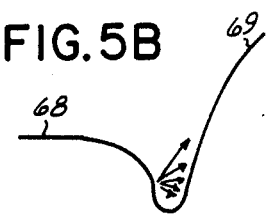

It has been found that sharp junctures of the type of juncture 70 affect the shape of the electrostatic field and other factors which influence the local erosion rate of the target surface. The effect of such a juncture is an increased erosion rate close to the juncture 70. The resulting erosion causes the surface of the target 61 in the region of the angle 70 to take the form of a V-shaped cusp having walls which increasingly become steeper and opposed to each other. As sputtering progresses further, this erosion becomes exceedingly pronounced in the region of the juncture 70 as shown in FIG. 5C. Such a cusp will progress through the target and the life of the target will be thereby substantially reduced. With this form of erosion, substantial amounts of the target material will go unused, and sputtering efficiency will roll off rapidly in the eroded region around the juncture 70 as will be explained further below.

Where ions strike a surface which is not flat but contains angular junctures such as at 70 in FIGS. 5A–5C, atoms emitted at wide acute angles near the juncture will, to some extent, strike the immediately adjacent surface. For example, atoms emitted from the point 78 on the surface 68 in FIG. 5A immediately adjacent the juncture 70 at shallow angles as shown by arrows 79 will strike the surface 69.

Figure 6A:
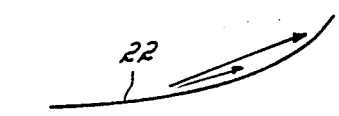
FIGS. 6A, 6B and 6C are diagrams of the erosion patterns, similar in format to FIGS. 5A–C, but for a target embodying principles of the present invention.
Figure 6B:
Figure 6C:
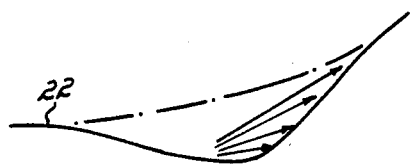

In contrast, a target 21 according to certain principles of the present invention, as shown in FIGS. 6A–6C, more widely distributes the accelerated erosion effect. The provision of the smooth and continuously curved surface 22 of the present invention makes uniform this erosion effect. Preferably, the surface 22 has an elliptical, circular or similar cross section. With a surface 22 being approximately circular in section, the probability that an emitted atom will strike an adjacent target surface is uniform across the surface. Thus, any non-uniformity in erosion will be caused by other more controllable factors, such as the placement and intensity of the magnetic field which concentrates the plasma 92, for example. As such, the erosion pattern will progress to resemble more the shape shown in FIGS. 6B and 6C as the sputtering process proceeds.

Figure 7A:
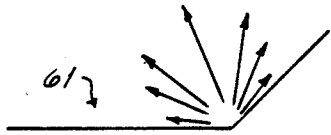
FIGS. 7A, 7B and 7C are diagrams illustrating sputtering emission patterns associated with the erosion patterns of FIGS. 5A–5C.
Figure 7B:
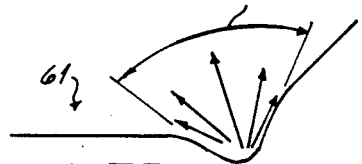
Figure 7C:
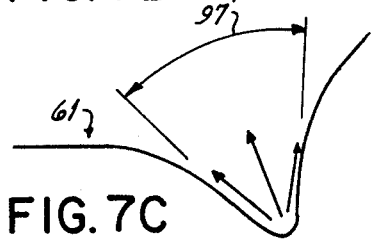

In addition to limiting the life of the target, one other undesirable effect of the cusp formation is the cathode "roll-off" effect which occurs. As the targets erode as illustrated in FIGS. 5A-5C, the deep cusp causes an increasingly greater percentage of the emitted atoms to strike the adjacent target surface. As this occurs, the erosion progresses through the stages as shown in FIGS. A through C of FIG. 7, and a self-shadowing effect occurs as the adjacent surface masks and narrows the angle 97 (FIG. 7B) and 97' (FIG. 7C) at which the emitted atoms can leave the surface of the target 61. This causes a loss of sputtering efficiency. It also causes an increase in the separation between the substrate 14' (FIG. 3) and portions of the target surface in the eroded regions. The change in geometry results in changes in electrical characteristics related to the sputtering rate.

Figure 8A:
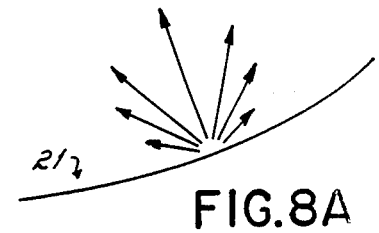
FIGS. 8A, 8B and 8C are diagrams of the emission patterns, similar in format to FIGS. 7A–7C, but for the erosion patterns produced by targets of the present invention as illustrated in FIGS. 6A–6C.
Figure 8B:
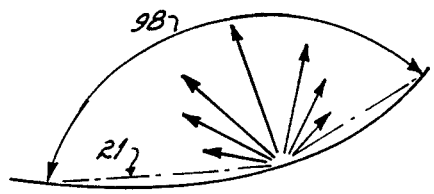
Figure 8C:
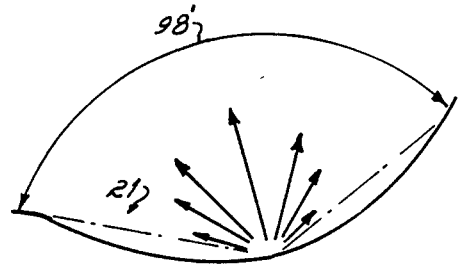

Furthermore, this roll-off is not uniform across the surface of the target, compromising the uniformity by which the material is sputtered from the target surface, and consequently the uniformity by which the coating is deposited across the substrate. In addition, the shadowing itself intercepts sputtered atoms which otherwise would impinge upon and coat the substrate, further undermining the performance of any target design geometry which had been selected to uniformly coat the target. In contrast, with the erosion pattern of this invention shown in FIGS. 6A-6C, the self-shadowing effect and roll off due to this phenomenon is substantially reduced. As the wide angles 98 (FIG. 8B) and 98' (FIG. 8C) show, emitted atoms leave the surface of the target 21 with little or no shadowing.

The flat surfaces of planar and some other target configurations of the prior art, while avoiding the cusp formation problem to some degree, present other undesirable features as illustrated in connection with FIGS. 9A and 9B. In FIG. 9A is illustrated a planar target 100 having a pair of concentric plasmas 101 and 102 producing two concentric erosion regions 103 and 104 on the target 100. A wafer 105, when positioned parallel to the target 100 will tend to develop a coating distribution which is heavier in the region immediately opposite the plasma bands as shown by profile 106 in the diagram of FIG. 9A. This effect can be reduced by separating the wafer 105 from the target 100 by a greater distance, but when this is done, the sputtering efficiency declines. Nonetheless, portions of the wafer closer to the center are also closer to more portions of the target and accordingly receive more intense and thicker coating layers than do the regions near the target wafer edge.

FIG. 9B illustrates the prior art approach of using geometrically and electrically distinct targets. In some such devices, the plasma 102' adjacent the outer edge of the target has a density which differs from that of the inner plasma 101'. In some two part targets, the outer edge of the target 100' is beyond the edge of the wafer 105', thus making the target 100' of greater diameter than that of the substrate wafer 105'. In some prior art target assemblies, the outer target 108 is closer to the substrate wafer 105' than the inner portion 107 of the target 100'.

In some prior art devices, the cathode electrical energy to the outer target 108 is different than that applied to the inner target 107. However, in the prior art, energizing the various parts of the target differently has meant separately isolating the inner region 107 of the target 100' from the outer region 108 of the target 100' and in effect using two targets. A combination of these efforts is shown in FIG. 9B, which still results in less than totally uniform coating 106' on the wafer 105'.

FIG. 10 illustrates certain aspects of the present invention which achieve, in effect, the goals sought but not satisfactorily achieved by the prior art. These problems, and the value of the present invention in providing a solution to the problems of the prior art, are most apparent where the substrate wafers to be coated contain surface steps, the side walls of which present surfaces perpendicular to the plane of the wafer. Such surfaces also require coatings of significant thickness compared to those deposited on the planar surfaces of the wafer. This will be further explained in connection with FIGS. 11-13 below.

Referring to FIG. 11, a simplified diagram of the arrangement of FIG. 3 is illustrated. The wafer 14' to be coated may contain a number of vias in the form of holes or linear grooves 109a, 109b and 109c in the wafer surface 17' which have nearly perpendicular sides, referred to as steps. The steps 109a-c must also be coated with material sputtered from the target 61 to provide, for example, for connections between various layers of conductive material. These steps 109a, 109b and 109c have side surfaces 110' and 111' normal to the planar surface 17' and the plane 16' of the wafer 14'. The surfaces 110' and 111' are required to be coated with a thickness equal to a substantial portion of that of the surfaces parallel to the plane 16' in order to maintain adequate and sufficiently uniform conductivity. The thicknesses of the coatings on the sides 110' and 111' of these steps 109a-109c can be analyzed with respect to two phenomena discussed above: (1) the effects of the relative geometry of the target with respect to the substrate, and (2) the erosion pattern of the target.

First of all, every increment of any portion of the surface of a target, such as target 61, which emits the coating material is a certain distance from any other given increment of the surface of the substrate 14'. This distance effects the density of the sputtered coating onto that substrate increment due to the emission of target material from that increment of the target. Also, the angle of incidence upon the substrate of the impinging sputtered coating particle or atom, as well as the emission angle from the target, causes the distribution onto the substrate surface to be diminished roughly in proportion to the cosine of the angle between the line joining the two increments and the lines normal to the two increments. In addition, the likelihood of a sputtered particle or atom adhering to a surface declines if the angle of incidence is too shallow. In addition to this, the self-shadowing effect described in connection with FIGS. 7 and 8 above, shields some portions of the substrate and target from each other as the target erodes. Impinging sputtered particles or atoms approaching a surface at an acute angle are also more widely distributed over the actual surface area. Furthermore, the sides of the step will "see" only portions of the target which they face. The sides of the steps also face plasmas of different intensities which further influence concentration of sputtered particles or atoms emitted from the underlying target regions. This too causes the amount of the coating material emitted from different target increments to differ.

In summary, as a result of the above phenomena, the thickness of the coating on a given increment of the surface of the substrate will be the result of an integration involving several variables over a hemisphere overlying each increment of the substrate surface. Generally, the result experienced by the prior art is non-uniform step coverage such as is illustrated in FIG. 12. As the geometry of FIG. 11 shows, the contributing factors result in the condition whereby the outwardly facing sides 110' of the steps, such as step 109a which are near the outer edge of the wafer 14', receive less coating thickness than those sides 111' facing inwardly. On the other hand, the coating deposition distribution on the outwardly and inwardly facing sides 110" and 111", respectively, of identical steps, such as step 109b, located near the center of the wafer 14' are less so effected.

The parameters which must be integrated to arrive at the deposition distribution include the geometric parameters described above and other parameters which affect the sputtering rate at each increment of target. These parameters include the electrical parameters which are related to sputtering power at local areas of the target, including the strengths of the magnet currents which sustain and shape plasma supporting magnetic fields over respective target regions, and the currents and thus the power delivered to the target circuit, and the duty cycle and thus the total energy at each target region.

The geometric factors which affect the thickness of the coating on the differently facing surfaces of the substrate are illustrated in FIG. 13 with respect to the smoothly contoured concave surface 22 of the target 21 of the present invention. The radial cross section at the surface 22 is preferably a segment of a circle, that is, of constant radius. The outer edge 24 of the surface 22 lies outside of the wafer 14, but closer to the wafer plane 16 than the inner edge 23 of the target surface 22. Thus, every increment of the substrate 14 "sees" at least some portion of the target surface 22. However, according to the present invention, the target 21 is shaped and energized so that the sum of material sputtered from the entire target area visible from each increment onto that increment is approximately the same for each increment of substrate.

More specifically, the increment 112 is on the surface 22 near its inner edge 23. The increment 112 faces slightly outwardly as shown by the normal unit vector 115. Coating material is emitted in this direction normal to the surface 22 at that increment 112. As explained previously in connection with FIGS. 5-8, however, material is emitted at all angles acute to the target surface but at lesser intensity than in the normal direction. As illustrated in FIG. 13, a particular step 109a has an inwardly facing side near the edge of the wafer 14. The substrate increment 111 will receive particles emitted from a target increment 112 emitted in the direction of the arrow 114 at angle 113 from the normal unit vector 115. The emission intensity in the direction of the arrow 114 is represented by the length of the arrow 114, which is related to the intensity normal to the increment 112, represented by the vector or arrow 115, by approximately the ratio of the cosine of the angle 113. Similarly, the particles or atoms emitted from increment or point 112 impinge upon the surface 111 at the angle 116. These particles or atoms also travel through a distance represented by the length of the line 117. As the particles travel the length 117, they diverge so that the farther they travel, the thinner the coating deposit from the target increment becomes.

The inwardly facing step side 111 receives a deposit of sputtering material from the emission from all increments or points of the sputtering target 21 which are visible from the increment 111 in strengths which diminish with increases of the distances and angles as described above.

Accordingly, material is sputtered from target increment 122 and toward the substrate increment 111 at an angle 123 from the unit vector 125 which is normal to the surface increment 122. Its intensity relative to that in direction 125 is the cosine of the angle 123, and is illustrated by the arrow 124. This emitted material travels a distance 127 to impinge upon the substrate increment 111 at an angle 126 with its normal surface 111.

The relative distances 117 and 127 affect a dilution in the intensity of coating atoms impinging upon the surface increment 111 in approximately inverse proportion to the squares of those distances. It can be appreciated however that no energy from an invisible point or increment, such as increment 130, will impinge upon the surface increment 111 since point 130 cannot be "seen" from surface 111. Atoms or particles emitted from point 130, however, will impinge upon the outwardly facing step surface 110. The same relationships with respect to angles and distances discussed above apply as they applied to the emissions from points 112 and 122 upon surface 111.

It will be immediately appreciated that far less target is visible to the incremental surface 110 than to the surface 111. However, with the target configuration illustrated in FIG. 13, the point 130 of the target is closer to surface 110 than are the points on the target 112 and 122 to the surface 111. This closeness will, in part, compensate for the lack of target area visible to the surface increment 110. In addition, the increment 130 and other increments of the surface 22 near the outer edge 24 of the target 21 are positioned closer to the plane 16 of the substrate 14. As such, increments of the surface 22 nearer the target edge 24 face inwardly approximately toward and in line with the outwardly facing sides, such as side 110, of the step 109a. Therefore, the angles between the increment normal vectors and the line joining the increments is less, so that a greater proportion of material sputtered from increments near the edge 24 of the target surface 22 is deposited into increment 110.

The above analysis of geometric parameters in connection with FIG. 13 treats every increment of target surface as emitting sputtered material at the same rate. The actual emission rates of the each target surface increment depend, however, on the electrical parameters which determine the ion bombardment rate upon each such increment. These include primarily those affecting the intensity and location of the plasmas and of the cathode energy.

Accordingly, the present invention contemplates an increase in erosion rate and particle emission rate from the region of the outer plasma 92 than from the inner plasma 91. This is done by increasing the relative strength of plasma 92 with respect to plasma 91. This is in turn preferably accomplished by increasing the power supplied to the plasma 92. As such, the rate of deposition of coating on surface 110 from the target region underlying plasma 92, such as the increment 130, is increased in relation to the deposition upon surface 111 from regions underlying the weaker inner plasma 91, as for example, from increment 112. Emissions from the regions on the far side of the target containing points such as point 122 which also underlie the stronger plasma 92 are far removed and effect coating thickness only slightly.

The electrical parameters which determined the intensities of the plasmas 91 and 92 can be established with knowledge of the geometry of the target 21. The currents through the magnets produce the magnetic fields supporting the plasmas 91 and 92. These can be established at levels which contribute to the uniform distribution of the deposition of coating material on the surface 17 of the substrate 14. However, additional complications arise during the course of the process of sputtering as erosion of the target occurs.

The features described above for establishing parameters to provide uniform step coverage of wafer substrates do not account for time varying changes in the emission from the target 21 with time. As shown in FIG. 14, and discussed above in connection with FIGS. 3-8, erosion of the surface 22 of the target 21 will result in an increase in the concavity of the surface 22 in the localized regions 94 and 95 respectively underlying the plasmas 91 and 92. This will cause a decrease in the effective rate of emission of particles from the target surface 22 in the eroded regions 94 and 95. Furthermore, the erosion of those regions will be unequal.

Prevention of irregular erosion, as many efforts of the prior art have stressed, is not a solution to the problems of time varying emission caused by erosion. This is because unequal erosion is the natural result of the use of unequal plasma strengths to help correct for non-uniform deposition distribution caused by geometric factors. Because the outer region 95 is preferably operated with a more active plasma 92 than the inner region 94, the erosion is necessarily greater in this outer region 95. For this reason, the target 21 of the present invention is thicker beneath the region 95 than elsewhere to provide the material necessary to allow for the irregular erosion. Nonetheless, the erosion roll off, or the decrease in target emission rate as a result of erosion of the target, will be greater for the outer target region 95 than for the inner target region 94 as is shown in the graph of FIG. 15. Thus, the established electrical and geometric parameters must be capable of selective adjustment if the coating uniformity is to be maintained over the life of the target.

In order to increase the likelihood that the rate of emission of sputtering material from specific inner and outer regions of the target proceed at a desired rate, the sputtering power of the respective inner and outer portions of the cathode target can be specifically and separately controlled according to the present invention.

Figure 16:
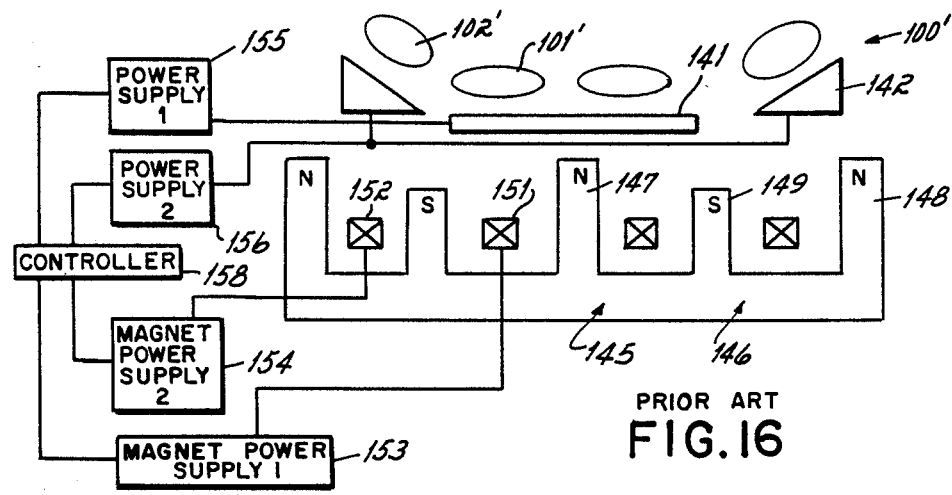
FIG. 16 is a block diagram of a control system of a multiple emission region target assembly of the prior art.

FIG. 16 shows a prior art cathode structure 100' in which two separate and electrically isolated target sections, including an inner target 141 and an outer target 142, are employed. Such target structures are commonly found in the prior art, configured such that the inner target 141 is a planar disc shaped target while the outer target 142 is an annular frusto-conical target which surrounds the inner target 141. With this configuration, separate inner and outer annular plasmas 101' and 102' are maintained adjacent the targets 141 and 142, respectively, through the generation of plasma supporting magnetic fields by energizing the windings 151 and 152, respectively, of magnets 145 and 146, respectively. In the structure shown in FIG. 16, a target assembly 100' which includes the magnets 145 and 146 includes a central pole piece 147 on the axis of the target 100', an outer pole piece 148 surrounding the outer target 142, and a middle pole piece 149 which underlies the gap between targets 141 and 142. These magnets 145 and 146 are sometimes permanent magnets but are more often electromagnets energized by coils 151 and 152, respectively. Magnet coils 151 and 152 are energized by a pair of power supplies 153 and 154, respectively, and the separate electrically isolated inner and outer targets 141 and 142, respectively, are energized by power supplies 155 and 156. A controller 158 is sometimes provided to control the power output of the poWer supplies 153-156.

With such a configuration, it is possible to regulate both the strength of the respective magnetic fields 101' and 102' and the level of the power supplied to the targets 141 and 142. The disadvantage of this configuration is that two separate targets are employed and, in addition, four separate power supply outputs are called for. Such additional power supply need increases the complexity and cost of the apparatus. The use of separate electrically isolated targets also increases the complexity of the target assembly in requiring additional machine operations and construction, additional care to maintain electrical isolation of the two target sections, additional effort and added means to seal the vacuum chamber at the multiple seams presented by the complex target and other complexities which are manifested in the added structural details of such an apparatus. Further, not only the target, but many parts of the assembly may have to be changed or redesigned when different wafers are to be coated.

Figure 17A:
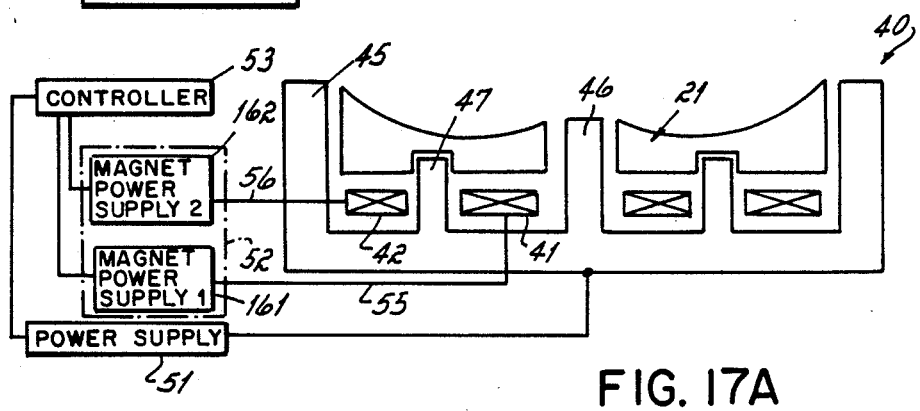
FIG. 17A is a simplified block diagram of the control portion of the system of FIG. 1 for a sputtering target assembly according to the principles of the present invention.
Figure 17B:
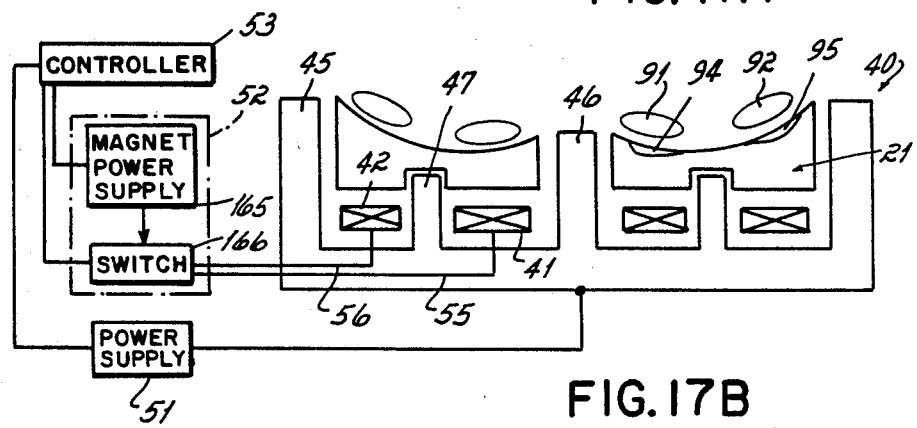
FIG. 17B is a block diagram of another and preferred embodiment of the control portion of the system of FIG. 17A.

FIG. 17A and 17B show schematically a sputtering apparatus according to principles of the present invention. This apparatus includes the one-piece smooth concave annular target 21, the magnetic pole piece assembly 40 with the outer, inner and middle pole pieces 45, 46 and 47, respectively, and the inner and outer electromagnet windings 41 and 42, respectively. A single power supply 51 energizes the target. A magnet power supply 52 energizes the magnets. Control circuitry 53 controls both of the power supplies 51 and 52.

In the embodiment shown in FIG. 17A, the magnet power supply includes two separate power supplies 161 and 162 to energize the magnet windings 41 and 42, respectively, with the power supplies 161 and 162 being controlled separately through the controller or control circuit 53.

With the embodiment of FIG. 17B of the present invention, the magnet power supply 52 includes a single power supply source 165 and a switching circuit 166 to alternately direct the output of the power supply 165 through output lines 55 and 56 to the inner and outer magnet windings 41 and 42, respectively. The control circuit 53 operates the switch 166 and magnet power supply 165.

With the embodiments of FIGS. 17A and 17B, no separate electrically isolated targets are employed, but only a single integrally formed target 21. Only a single power supply 51 is provided for energizing the target 21. Either one or two magnet power supplies will operate the windings 41 and 42.

In accordance with the principles of the present invention, the method and general operation and control of the apparatus will be described first with reference to FIGS. 17A and 17B and 18, then the circuit details will be explained more fully with reference again to FIG. 1.

Figure 18:
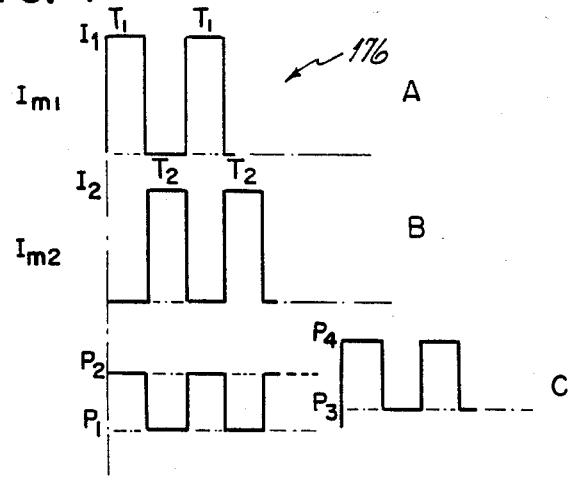
FIGS. 18A, 18B and 18C are timing diagrams illustrating the time-shared control concept of the system of FIGS. 17A and 17B.

Curves A and B in FIG. 18 show the current in the outputs 55 and 56 which respectively connect the magnet power supply 52 with the inner and outer magnet windings 41 and 42. The current waveforms are square waves which alternate on and off, each switching from zero to a current level predetermined by controller 53 to supply current to the magnet windings 41 and 42 at levels $I_1$ and $I_2$, respectively, to activate plasma confining magnetic fields (FIG. 4) adjacent respective regions 94 and 95 of the target surface 22. The currents $I_1$ and $I_2$ are alternately delivered to outputs 55 and 56, respectively, by switching the outputs of magnet power supplies 161 and 162 in the embodiment of FIG. 17A, or by the switching of the output switch 166 in the embodiments of FIG. 17B. The currents $I_1$ and $I_2$ endure for predetermined periods $T_1$ and $T_2$, respectively, established by controller 53, and as such constitute the duty cycles of the inner and outer target regions, respectively.

The current in the magnet windings 41 and 42 operating under the control circuitry 53 are, in the preferred embodiment, alternately on and off. Neither of the two magnet windings 41 and 42 is on while the other is on during at least a portion of each duty cycle, and preferably, during the entirety of each duty cycle. The effect of this is to cause the two plasmas 91 and 92 to be activated alternately. Since the sputtering rate is substantially greater with an energized plasma existing in the respective region 94 or 95 of the target 21 than with no energized plasma, material is sputtered from the target 21 alternately from the regions 94 and 95 underlying the plasma rings 91 and 92. As such, the power from the power supply 51 will be alternately drawn almost entirely to the inner region 94 and then the outer region 95 of the target 21, respectively in accordance with the switching from the inner plasma 91 to the outer plasma 92.

When the inner plasma 91 only is energized, the entire output, or substantially the entire output, of power supply 51 will be delivered to the region 94 underlying the plasma 91. The energizing of a plasma reduces the impedance at the target region underlying the energized plasma. The impedance remains extremely high at all other target regions. Thus, substantially all target energy is expended in energized region 91. Alternatively, when the outer plasma 92 only is switched on, by energizing the winding 42, all of the power or substantially all of the power from power supply 51 will be delivered to the region 95 underlying the plasma 92.

Accordingly, the sputtering energy will be almost completely switched between the inner and outer regions 94 and 95, with neither region generating or emitting significant sputtering material while the other region is so energized. As a consequence, certain established electrical parameters of the single power supply 51 relate to only one selected region of the target 21 during the time when that region only is energized. More importantly, separate electrical parameters may be established for different regions of the target 21 without the need to have the target divided into physically distinct or electrically isolated parts. Such parameters include, for example, the current, voltage and/or the duty cycle of power delivered by the power supply 51 to the target 21.

Importantly, measurement of operational electrical parameters associated with the power being delivered from power supply 51 to specific regions of the one-piece target 21 is now possible with the present invention. From such measurement, the amount of energy and the sputtering rate of the respective inner and outer regions 94 and 95 of the one piece target 21 can be separately determined. Such measurements are capable of determining precisely the amount of power that is being delivered from power supply 51 during the portions of each cycle during which either the inner or outer plasma regions 91 or 92 are energized.

If, for example, one electrical parameter such as cathode voltage is being delivered to the target, that voltage can be measured and regulated. In addition, the current drawn by the target during operation can be monitored for changes. These changes or changes in other electrical parameters may occur as a result of changes in target geometry or in other geometric characteristics of the target surface due to target erosion. Such changes will occur locally at the different target regions 94 and 95 and can, with the present invention, be measured by a detector at the output of the power supply 51. Thus, changes can be made by the controller, from information derived from the selective measurement of the operational electrical parameters of the respective target regions, to change other regulated electrical parameters to compensate for target erosion and to maintain a uniform deposition distribution across the substrate surface. The output of the power supply 51 in response to such control is illustrated in FIG. 18C.

As FIG. 18C shows, the level of the output of the power supply 51 may initially switch from a first level $P_1$ to a second level $P_2$ to maintain the power levels differently between the inner and outer regions 94 and 95, respectively. Such levels once established would be maintained as long as the target is in its original condition. As the target erodes, however, these levels may be changed with time as shown at the right in FIG. 18C. Due to a small amount of erosion, for example, the inner region 94 is energized at new level $P_3$, only slightly greater than level $P_1$ at which it was initially energized. The outer region 95 is energized at level $P_4$, which may be substantially greater than its initial level $P_2$ due to the more serious erosion which may be expected to occur in the outer region 95.

While the control function is described in terms of controlling the power from the power supply 51, a measurement of the power parameters of current, voltage, impedance or a combination of any or all of these or other related parameters may be used by the controller 53 to adjust or modify any of those parameters or other parameters with time. For example, such measurements may be used to control the intensity or duration of the current pulses to the magnets shown in FIGS. 18A and 18B and thus the duty cycles of the respective target regions. In addition, while the embodiments are described in connection with two target regions, more than two regions can be controlled in this manner.

The waveforms of FIGS. 18A-18C illustrate a controlling of the target emission distribution by repeatedly alternating the energization of the target from region to region. It is preferred that the energizing of the target regions be done repeatedly during the coating of each wafer. The waveforms of FIGS. 18A-18C also illustrate the timing of the energization of the target regions such that no two regions are simultaneously energized. In this way, the sputtering energy expended at each target region can be more readily known; accordingly, such timing is preferred. Where more than one region is energized simultaneously, that is, where the waveforms relating to two regions overlap in time, the power consumed cannot be related to one region of the target without additional measurement, analysis, or calculation. Similarly, measurements of electrical operating parameters are more direct and yield information relating to individual target regions when taken during times when only one target region is energized. Accordingly, for appreciation of certain features of the invention, it is important that each region of the target be energized for some period when no other region is energized. For the appreciation of many of the advantages of the present invention it is important and preferred that at all times only one region of the target be energized.

Figure 19:
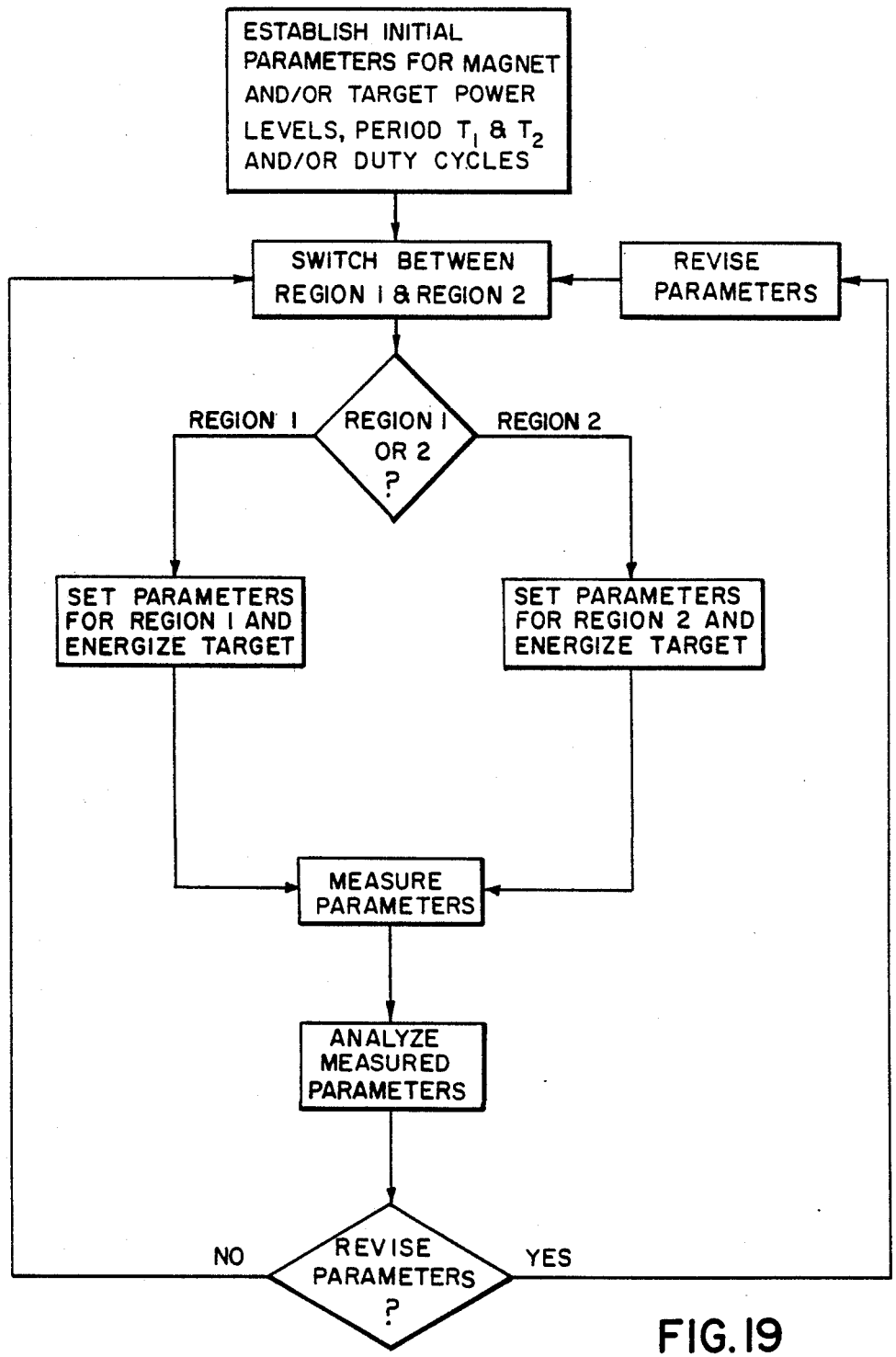
FIG. 19 is a flow chart illustrating the operation of the control portion of the system of FIG. 1.

Returning now to FIG. 1, the electrical control portion of the preferred embodiment of the present invention can be more fully described. As FIG. 1 shows, the electrical circuitry 50 includes the control circuit 53 which contains microprocessor, timers or other appropriate circuitry for performing the steps such as shown in the flow chart of FIG. 19 and as further described herein. The control circuit or controller 53 has a pair of analog outputs 172 and 173 which carry signals which determine the timing of activation and the energization levels for the magnet power supply for alternately onto output lines 55 and 56 which are connected to the magnet windings 41 and 42, respectively.

As illustrated diagrammatically at 176 (FIG. 18), a square wave having a duration $T_1$ in one state and a duration $T_2$ in the other state as controlled by the circuit 53 applies the waveform 176 to switch the signals on lines 172 and 173 of the switching circuit 166 to alternately switch the magnet power supply output currents between the lines 55 and 56 in accordance with that shown in FIG. 18. The waveform 176 is also applied to the current level outputs 172 and 173 to switch the current levels between $I_1$ and $I_2$ in synchronism with switch 166 to deliver the proper currents $I_1$ and $I_2$ to the respective magnet windings 411 and 42 for respective time periods $T_1$ and $T_2$.

The controller 53 includes a microprocessor which has an analog output which represents the desired power levels at which the power supply 51 should energize the target 21 during the respective portions of the cycle $t_1$ and $t_2$ during which magnets 41 and 42, respectively are activated. The outputs 55 and 56 switch circuit 52 to synchronize the power level setting output 191 with the energization of the magnets 41' and 42', respectively, thus regulating the power through regulation of the voltage of an output amplifier.

The output amplifier, contained in the target power supply 51, thus switches its output between the two levels predetermined by the controller 53, in synchronization with the activation of the magnet windings 41 and 42, respectively. The output amplifier of the cathode power supply 51 has its output connected to the output 54 which connects to the target 21. The cathode power supply 51 also has an output 190 connected to the controller 53 to communicate such information as is desired to the controller 53 regarding the actual power, impedance, current, voltage, or other such parameter. The controller 53 a control output 191 for controlling the operation of the power supply 51 will, in the preferred embodiment be in accordance with the waveform of FIG. 18C. More particularly, the detected signal is used to readjust or change the electrical parameters such as current to the magnet windings 41 and 42 as controlled by outputs 172 and 173, the regulated levels of operation of the power supply 51, the duty cycles or duration times $T_1$ and $T_2$ or any other electrically controllable parameters. This control is done, for example, to fix the uniformity of the deposition distribution of coating on the substrate 14.

The feedback signal on line 190 may be related to changes in target geometry due to erosion. To measure target erosion or sputtering rate, however, other means are contemplated in accordance with embodiments of the present invention, such that the employment of a target deposition rate monitor 194 or a target erosion depth monitor 195, illustrated in FIG. 1 having outputs 197 and 198 connected to inputs of the controller 53. The readjustment of parameters may be performed by the controller 53 in accordance with the signals from either lines 190, 197, 198 or such other signal which is responsive to changes in parameters, such as a geometric parameter, as for example, target erosion. In this way, the electrical parameters, such as $I_1$, $I_2$, $T_1$, $T_2$, or components of $P_1$ or $P_2$, or other parameters are readjusted.

It should be understood that while the discussion of this embodiment refers to control of the power from the power supply 51, other parameters such as the voltage or the current levels may be controlled in either similar fashion or may be each otherwise varied in accordance with the logic of or parameters predefined within the controller 53.

The erosion depth monitor 195 may be an adaptation of laser instrumentation technology for measuring distance, and thus the erosion of, the target surface 22 at a region toward which a laser beam from the monitor 195 is directed. Such a monitor would be positioned near the substrate.

The deposition rate monitor 194 may be of a quartz crystal type known in the sputtering art, or such other type as may have been or may hereafter be developed. Such a monitor, positioned near the substrate, measures incident sputtered material and produces a signal proportional to the sputtering rate of the target, provided geometric relationships are taken into account. Such a signal, with the present invention, will reflect different sputtering rates as different regions of the target are energized. Thus, the measurement, if synchronized with the activation of the magnets, will provide information related to the separate target regions for use in controlling the operations from the controller 53. Similarly, output signals on line 190 will be similarly synchronized to target region activation.

In accordance with the principles of the present invention, the advantages recited above and others are realized and improved uniformity in the deposition distribution across the substrate may be accomplished.

While the ability to isolate and separately measure various parameters associated with the operation of different regions of a one piece target has been provided by the present invention, it is contemplated that other means for monitoring parameters may be employed or hereafter developed which will realize the advantages of the present invention. In addition to or instead of measurement of erosion depth or deposition rate, cathode current, voltage, impedance and power measurements, glow discharge spectroscopy, film reflectivity monitoring, or other such measurements may be employed. The invention provides particular advantage for measurements which differ during the respective energization periods of the target regions to measure parameters which correspond to the sputtering operation during such periods.

What is claimed is:

1. A sputtering apparatus for depositing a controlled distribution of coating material onto a substrate, said apparatus comprising:

an annular target formed of a single piece of sputtering material and having a smoothly contoured concave sputtering surface;

means for generating first and second magnetic fields respectively adjacent different first and second target regions on said sputtering surface; and means for energizing said target so as to sputter said material from said first and second regions of said target in accordance with the generation of said respective magnetic fields.

2. The apparatus of claim 1 further comprising means for activating said magnetic field generating means to alternately generate said first and second magnetic fields.

3. The apparatus of claim 1 further comprising:

means for establishing separate sets of electrical parameters, one set for each of said regions so as to cause the deposition of the sum of material sputtered from said all of said region to be of a desired distribution across the substrate surface;

said magnetic field generating means including first and second separately activatable electromagnets, each positioned so as to generate, when activated, first and second magnetic fields respectively adjacent said first and second target regions to cause the emission of sputtered material, from the respective target region adjacent the activated magnetic field when said target is energized;

said parameter establishing means including a timing circuit for alternately activating said first and second electromagnets; and said energizing means including a power supply operable for alternately energizing said target, in synchronism with the activation of the magnetic fields adjacent to the respective target regions, in accordance with the electrical parameters established for each corresponding respective target region.

4. The apparatus of claim 3 further comprising:

means for detecting an electrical condition of said target in synchronism with the activation of the magnetic fields; and controller means for changing at least one of said electrical parameters in response to the detected electrical condition.

5. The apparatus of claim 4 wherein the detected electrical condition is a parameter related to the power being consumed by said target.

6. The apparatus of claim 4 wherein said power supply is operable to regulate at least one electrical parameter of said target in synchronism with the activation of the magnetic fields.

7. The apparatus of claim 3 wherein said timing circuit is operable to control the relative duration of the activation of said electromagnets.

8. The apparatus of claim 3 wherein said timing circuit is operable for establishing the relative times during which said power supply energizes the first and second regions of said target.

9. The device of claim 3 wherein the electrical parameters include:

the current delivered to first and second electromagnets for respectively generating said first and second magnetic fields;

the current and voltage applied to said target when said target is energized; and the relative duration of the time periods during which the respective first and second magnetic fields are activated.

10. An apparatus for depositing a uniform distribution of sputtered material upon differently facing increments of a substrate surface, said apparatus comprising:

a target of sputtering material having a generally concave sputtering surface supported in spaced relationship with the surface of the substrate, said sputtering surface having at least two regions including a first and a second target region defined thereon, each said target region having different geometric parameters defining the geometric relationship of the region with the differently facing increments of the substrate surface;

a controller operable for establishing separate sets of electrical parameters, one for each of said target regions, said sets of electrical parameters being so related to said geometric parameters as to cause the deposition of the sum of material sputtered from all of said regions to be of a desired distribution across the substrate surface;

at least two individually activatable magnets including a first and a second electromagnet positioned to generate, when activated, at least two magnetic fields including a first and a second magnetic field respectively corresponding to said first and second target regions to cause the emission of sputtered material from each respective target region corresponding to an activated magnetic field when said target is energized;

a timing circuit for activating one of said first and second electromagnets while the other is deactivated; and a power supply operable to energize said target, in synchronism with the activation of the electromagnets, in accordance with the electrical parameters established for the target region corresponding to the magnetic field generated by the activated electromagnet.

11. The apparatus of claim 10 further comprising:

a detector operable to measure one of said parameters of said target to determine changes in said geometric relationships between the target region adjacent the activated field and the substrate surface; and said controller being operable for changing at least one of said electrical parameters in response to said measuring of said measured parameter so as to compensate for changes in said geometric relationships to cause the deposition of the sum of sputtered material sputtered from all of said regions to be of said desired distribution across the substrate surface.

12. The apparatus of claim 10 further comprising:

a detector operable to measure one of said parameters of said target; and said controller being operable for changing at least one of said electrical parameters in response to said measured parameter.

13. The apparatus of claim 12 wherein said detector includes a monitor which measures the rate of deposition onto the substrate.

14. The apparatus of claim 13 wherein said detector is quartz crystal deposition rate monitor.

15. The apparatus of claim 12 wherein said detector includes a monitor which measures the surface depth at a portion of the sputtering surface of said target.

16. The apparatus of claim 12 wherein said controller is operable to control, in response to said measured parameter, an electrical parameter of the respective sets for one of said regions in synchronism with the activation of the electromagnet which generates the field corresponding to that region.

17. The apparatus of claim 10 further comprising:
a detector operable to measure one of said parameters in synchronism with the activation of the magnetic fields.

18. The apparatus of claim 17 wherein the measured parameter is an electrical parameter.

19. The apparatus of claim 18 wherein the measured parameter is related to the power being consumed by said target.

20. The apparatus of claim 10 wherein said timing circuit is operable to alternately activate said electromagnets.

21. The apparatus of claim 20 wherein said circuit is operable to alternately activate said electromagnets repeatedly through a plurality of cycles.

22. The apparatus of claim 10 wherein an electrical parameter which said controller is operable to establish is the ratio of the time periods during which said power supply energizes the respective first and second regions of said target.

23. The apparatus of claim 10 wherein said timing circuit is operable to activate said first and second magnets only when the other of said magnets is deactivated.

24. The apparatus of claim 10 wherein said power supply is regulated so as to deliver, in synchronism with the activation of the magnetic fields, at least one operational electrical parameter of said target at a level equal to the initial electrical parameter associated with the respective target region corresponding to the activated magnetic field.

25. The apparatus of claim 10 wherein said geometric relationships include the distance separating each increment of the target surface within each region from each increment of the substrate surface visible therefrom, and the angles of each such substrate surface increment with respect to each target surface increment.

26. The apparatus of claim 10 wherein said target regions include a first annular region surrounding the center of said target and a second annular region surrounding said first annular region.

27. The apparatus of claim 10 wherein the sputtering material of which each region of said target is formed is electrically connected.

28. The apparatus of claim 10 wherein said target is formed of a single piece of sputtering material.

29. The apparatus of claim 28 wherein the sputtering surface of said target is a figure of rotation about an axis of said target.

30. The apparatus of claim 10 wherein said substrate generally defines a plane, and wherein said target comprises a single piece of sputtering material and has:
an annular shape facing and having an axis perpendicular to said substrate and concentric therewith, and has a circular inner edge and a circular outer edge, a diameter larger than that of said substrate,
a sputtering surface facing said substrate which has a generally overall concave shape whereby said outer edge lies closer to the plane of said substrate than does the interior of said target surface of said inner edge, and
said sputtering surface is continuous and smooth across its cross section along the radius thereof between said inner and outer edges.

31. The apparatus of claim 30 wherein said first target region is a figure of revolution about said axis on said sputtering surface surrounding said inner edge of said target, and said second target region is figure of revolution about said axis lying on said sputtering surface between said first region and said outer edge.

32. The apparatus of claim 31 wherein said target is thicker at said outer edge than at said inner edge and includes more sputtering material underlying said outer region than underlying said inner region.

33. The apparatus of claim 10 wherein said electromagnets include a common pole piece underlying said target between said first and second regions.

34. The apparatus of claim 33 wherein said target has a back surface opposite said sputtering surface and said pole piece is imbedded in said back surface near and beneath said sputtering surface.

35. The apparatus of claim 34 wherein said target is annular and said pole piece is an annular ring concentric with said target.

36. The apparatus of claim 34 further comprising means including said pole piece for structurally reinforcing said target and restraining said target against thermal expansion.

37. The apparatus of claim 34 wherein said pole piece includes cooling means for removing operational heat from said target.

38. The apparatus of claim 10 wherein said sputtering surface of said target in said second target region includes increments of target surface approximately facing the outwardly facing sides of steps on the surface of said substrate.

39. The apparatus of claim 10 wherein said sputtering surface contains no increment in said target regions which is not smooth and continuous.

40. The apparatus of claim 10 wherein the established electrical parameters include:
the current delivered to first and second electromagnets for respectively generating said first and second magnetic fields;
the current and voltage applied to said target when said target is energized; and
the ratio of the time periods during which the respective first and second magnetic fields are activated.

41. A magnetron sputter coating apparatus for depositing across the surfaces of substrates a desired distribution of sputtering material and for controlling said distribution as different regions of a sputtering target of said apparatus erode at difference rates, wherein said target has a sputtering surface facing toward said substrate, said sputtering surface having defined thereon first and second regions, and wherein said apparatus further comprises:
a controller establishing separate electrical parameters for each of said regions, which parameters, if maintained, will result in the deposition of the sum of material sputtered from all of said regions of said target to be of said desired distribution across the substrate surfaces;
a first and a second individually activatable electromagnet, each magnet being positioned so as to generate, when activated, a magnetic field corresponding to a respective one of said first and second target regions to cause the emission of sputtered material, and the erosion of said target, at the target region corresponding to an activated field, when said target is energized;

a circuit for alternately activating said first and second electromagnets;

a power supply operable to alternately energize said target in accordance with the electrical parameters established for each respective target region and in synchronism with the activation of the magnetic field corresponding to the respective target regions;

a detector operable to measure a parameter associated with said target to determine changes in said operational electrical parameters associated with changes in the state of erosion of each of the respective adjacent target regions; and said controller being operable to revise, in synchronism with the activation of said magnetic fields, at least one of the established electrical parameters associated with at least one of said regions in accordance with the measurement by said detector.

42. The apparatus of claim 41 wherein the established electrical parameters include:
the current delivered to said first an second electromagnets for respectively generating said first and second magnetic fields;
the current and voltage applied to said target when said target is energized; and
the time periods during which the respective first and second magnetic fields are activated.

43. The apparatus of claim 41 wherein the electrical parameter measured is related to the sputtering power of said target.

44. The apparatus of claim 43 wherein said power supply is a regulated power supply operable to deliver at least one electrical parameter to said target in synchronism with the activation of the magnetic fields at a level equal to that of the established electrical parameter associated with the respective target region corresponding to the activated magnetic field.

45. The apparatus of claim 41 wherein said power supply is a regulated power supply operable to deliver at least one electrical parameter to said target in synchronism with the activation of the magnetic fields at a level equal to that of the established electrical parameter associated with the respective target region corresponding to the activated magnetic field.

46. The apparatus of claim 41 wherein said circuit is operable to repeatedly activate said electromagnets alternately through more than one cycle.

47. The apparatus of claim 41 wherein said circuit is operable to activate said first and second electromagnets only when the other of said electromagnets is deactivated.

48. The apparatus of claim 41 wherein said detector includes a monitor which measures the rate of deposition onto the substrate.

49. The apparatus of claim 41 wherein said detector includes a monitor which measures the surface depth at a portion of the sputtering surface of said target.

50. The apparatus of claim 49 wherein said monitor includes a laser device positioned to detect the eroded depth of said portion, said controller being responsive to an output signal produced by said laser device in accordance with the detected eroded depth to so revise the parameters.

51. A device for separately controlling the deposition of sputter coating material from different regions of a sputtering target of a magnetron sputtering apparatus, said device comprising:
at least two separate magnets, including a first and a second magnet, for respectively generating a first plasma supporting magnetic field associated with a first one of said target regions and a second plasma supporting magnetic field associated with a second one of said target regions;
means for activating said first magnet and for deactivating said second magnet, and all other magnets generating plasma supporting magnetic fields associated with regions of said target other than said first region which are electrically connected to said first region during at least a portion of the time during which said first magnet is activated;
means for measuring an electrical parameter of said target during a time when said first magnet is activated and all other of said magnets are deactivated; and
wherein said target has a sputtering surface which comprises sputtering material and said target regions are areas on said sputtering surface of said target having at least one boundary defined by the intersection of lines of the magnetic field generated by the respective magnet with said sputtering surface.

52. The device of claim 51 further comprising:
a controller for adjusting the power applied to said target in response to the output of said measuring means.

53. The device of claim 52 wherein:
at least one of said magnets is an electromagnet and said controller is operable to adjust the current applied to said electromagnet to set the strength of the respective magnetic field when said electromagnet is activated.

54. A target assembly for a magnetron sputtering apparatus, said target assembly comprising:
an annular target formed of a single piece of sputtering material, said target having a sputtering surface bounded by an inner edge and an outer edge extending forwardly of said inner edge, said surface being smooth, continuous and concave along a radial cross section from said inner edge to said outer edge;
at least two magnets positioned adjacent said target and including a first magnet operable to form an inner plasma confining magnetic field outside of the inner edge of said target and a second magnet for forming an outer plasma confining magnetic field inside of said outer edge of said target and outside of said inner field, said fields defining respective first and second concentric regions on said sputtering surface; and
the thickness of said sputtering material underlying said outer region continuously increasing outwardly from said inner region to a thickness greater than that underlying said inner region.

55. The assembly of claim 54 wherein said fields are circular plasma confining magnetic fields.

56. The assembly of claim 54 wherein said target is a figure of revolution formable on a lathe from a single piece of sputtering material.

57. The target assembly of claim 54 wherein said radial cross section of said sputtering surface is an approximately elliptical arc along said radial cross-section.

58. The assembly of claim 54 wherein said magnets include a common pole piece underlying said target between said first and second regions.

59. The assembly of claim 54 wherein said target has a back surface opposite said sputtering surface and one of said magnets has a pole piece thereof imbedded in said back surface near said sputtering surface.

60. The assembly of claim 59 wherein said pole piece is an annular ring concentric with said target.

61. The assembly of claim 60 wherein said pole piece functions to structurally reinforce said target and the restrain said target against thermal expansion.

62. The assembly of claim 61 wherein said pole piece includes cooling means for removing operational heat from said target.

63. The assembly of claim 54 wherein said sputtering surface contains no increment in said regions which is not smooth and continuous.

64. A magnetron sputtering apparatus comprising the target assembly of claim 54 and further comprising:
means for supporting a substrate wafer lying in a plane in spaced relationship with said sputtering surface and concentric therewith, said wafer having a maximum diameter; and
said target having an outer diameter greater than the diameter of said wafer, said outer edge of said target sputtering surface being closer to said plane than said inner edge.

65. The apparatus of claim 64 wherein said wafer has steps thereon, said steps having inwardly facing sides and outwardly facing sides, said sides being perpendicular to said plane, the outer region of said sputtering surface having inwardly facing areas near said outer edge directed approximately toward said outwardly facing sides of said steps.

66. A target for a magnetron sputtering apparatus, said target comprising:
a single annular piece of sputtering material, said piece having a sputtering surface bounded by an inner edge, an outer edge extending forwardly of said inner edge, an inner sputtering region thereon proximate said inner edge and an outer sputtering region thereon between said inner region and said outer edge;
said surface being smooth, continuous and concave across said regions along a radial cross section of said target; and
the thickness of said sputtering material underlying said outer region continuously increasing outwardly from said inner region to a thickness greater than that underlying said inner region.

67. The target of claim 66 wherein the sputtering surface of said target is a figure of revolution capable of being machined on a lathe from a single piece of sputtering material.

68. The target of claim 66 wherein the cross section of said sputtering surface is approximately elliptical along a radius thereof.

69. The target of claim 66 wherein said target has a back surface opposite said sputtering surface, said back surface having an annular groove therein extending to near said sputtering surface.

70. The target of claim 69 wherein said sputtering surface and said back surface are figures of revolution capable of being machined on a lathe from a single piece of sputtering material.

71. The target of claim 66 said sputtering surface contains no increment in said regions which is not smooth and continuous.

72. The target of claim 66 wherein:
the outer region of said sputtering surface has inwardly facing areas near said outer edge.

73. A method of depositing a desired distribution of sputtered material across the surface of a substrate and for controlling the deposition rate from different regions of a single-piece sputtering target which erode at different rates, said method comprising the steps of:
providing a one piece sputtering target and defining a plurality of differently facing regions thereon, including a first region and a second region;
establishing separate values for electrical parameters for each of said regions so as to cause the deposition of the sum of material sputtered from all of said regions to be of a desired distribution across the substrate surfaces;
activating a first plasma supporting magnetic field adjacent said first target region so as to cause the emission of sputtered material, and the erosion of said target, in said first target region when said target is energized;
energizing said target in accordance with the electrical parameter values established for said first target region while said first magnetic field is activated and other magnetic fields are deactivated;
activating a second plasma supporting magnetic field adjacent said second target region so as to cause the emission of sputtered material, and the erosion of said target, in said second region when said target is energized; and
energizing said target in accordance with the electrical parameter values established for said second target region while said second field is activated and other magnetic fields are deactivated.

74. The method of claim 73 further comprising the step of repeatedly alternating the activation of said first and second magnetic fields.

75. The method of claim 73 further comprising the steps of:
deactivating, and maintaining deactivated, plasma supporting magnetic fields adjacent all other regions of said target other than said first region during at least a portion of the time when said first field is activated; and
deactivating, and maintaining deactivated, plasma supporting magnetic fields adjacent all other regions of said target other than said second region during at least a portion of the timer when said second field is activated.

76. The method of claim 75 wherein said steps of activating said first and second magnetic fields occur at no timer simultaneously.

77. The method of claim 75 further comprising the steps of:
measuring an electrical parameter associated with said target when one of said magnetic fields is activated and said other magnetic fields are deactivated;
revising at least one of the established electrical parameter values associated with at least one of said regions in accordance with a result of the measuring step; and
repeating said activating and energizing steps in accordance with said revised parameter value.

78. The method of claim 77 wherein the electrical parameter measured is a parameter related to the operating power of said target.

79. The method of claim 77 wherein said method comprises the steps of regulating fewer than all of said electrical parameters at the respective established values and measuring at least one non-regulated electrical parameter of said target when said first magnetic field is energized and activated and said other magnetic fields are deactivated.

80. The method of claim 75 further comprising the steps of:
measuring the rate of deposition onto the substrate when one of said magnetic fields is activated and said other magnetic fields are deactivated;
revising at least one of the established electrical parameter values associated with at least one of said regions in accordance with a result of the measuring step; and
repeating said activating and energizing steps in accordance with the revised parameter values.

81. The method of claim 73 wherein the established electrical parameters include:
the current delivered to first and second electromagnets for respectively generating said first and second magnetic fields;
the current and voltage applied to said target when said target is energized; and
the relative time periods during which the respective first and second magnetic fields are activated.

82. The method of claim 73 wherein said energizing step includes the step of regulating an electrical parameter of said target at one of said established parameter values.

83. The method of claim 73 further comprising the steps of:
measuring the rate of deposition onto the substrate; and
revising at least one established electrical parameter in accordance with the result of the measuring step.

84. The method of claim 73 further comprising the step of:
measuring the surface depth of said target at a portion of the sputtering surface to determine the eroded depth of said target at said portion.

85. The method of claim 84 wherein said measuring step includes the step of directing a laser beam at said surface.

86. A method for depositing a controlled distribution of sputtered material across the differently facing surfaces of substrates, said method comprising the steps of:
providing a one-piece sputtering target and defining a plurality of differently facing regions on the sputtering surface of said sputtering target, said regions including a first region and a second region, said first and second sputtering surface regions facing different ones of said differently facing substrate surfaces;
establishing separate electrical parameter values for each of said regions so as to cause the deposition of the sum of material sputtered from al of said regions to be of a desired distribution across the substrate surfaces;
alternately activating first and second plasma supporting magnetic fields adjacent said first and second target regions to alternately cause the emission of sputtered material in the respective target region adjacent the activated field when said target is energized; and
alternately energizing said target in accordance with the respective electrical parameter values established for each respective target region and in synchronism with the activation of the magnetic field adjacent the respective region.

87. The method of claim 86 further comprising the steps of:
measuring a parameter associated with the sputtering rate from said target in synchronism with the activation of said magnetic fields;
revising at least one of the established electrical parameter values associated with at least one of said regions in accordance with a result of said measuring step; and
repeating said activating and energizing steps in accordance with said revised parameter value.

88. The method of claim 86 wherein said established electrical parameters include the relative times during which said first and second target regions are energized, and said method further comprises the step of establishing said relative times to affect the relative amounts of material sputtered from said regions and deposited from said regions onto the differently facing surfaces of said substrate.

89. A sputter coating method for separately controlling the deposition from different regions of a magnetron sputtering target, said method comprising the steps of:
activating a first plasma supporting magnetic field associated with a first one of said target regions while deactivating all other plasma supporting magnetic fields associated with other regions of said target which are electrically connected to said first region;
measuring a parameter related to the operation of said target in synchronism with the activation of said first magnetic field;
activating a second plasma supporting magnetic field associated with a second on of said target regions while deactivating all other plasma supporting magnetic fields associated with all other regions of said target which are electrically connected to said first region; and
measuring a parameter related to the operation of said target in synchronism with the activation of said second magnetic field

90. The method of claim 89 further comprising the step of adjusting the power applied to said target in response to a result of said measuring step.

91. The method of claim 89 wherein said first plasma supporting magnetic field is activated by an electromagnet, and said method further comprises the step of setting the activated field strength of said first magnetic field by adjusting the current applied to said electromagnet.

92. The method of claim 89 wherein said target comprises a single piece of sputtering material having a sputtering surface and said target regions are areas on said sputtering surface of said target each with a boundary defined by the intersection of lines of the associated magnetic field with said target sputtering surface.

93. The method of claim 89 further comprising the step of energizing said target, in accordance with electrical parameter values separately established for each of said respective first and second regions, and in synchronism with the activation of the magnetic field adjacent the respective region.

94. The method of claim 93 further comprising the step of establishing said electrical parameter values in response to information derived by said measuring steps.

95. The method of claim 93 wherein said activating steps are performed alternately.

96. The method of claim 93 further comprising the step of repeatedly alternating the performance of said activating steps.

97. The method of claim 89 wherein said measuring step includes the step of monitoring the rate of deposition onto the substrate.

98. A method for obtaining a desired distribution of sputtered material deposited across the surface of a substrate, said method comprising the steps of:
providing a target formed of a single piece of sputtering material having a sputtering surface in spaced relationship with the surface of the substrate, said target surface having a plurality of different regions thereon, each region having a different geometric relationship with the substrate surface so that material sputtered therefrom produces a different distribution across the substrate surface;
establishing a plurality of sets of values for electrical parameters, each associated with a different one of said regions, said values and said geometric relationships being related in such a way as to cause the deposition of the sum of material sputtered from all of said regions to be of the desired distribution across the substrate surface;
activating a plurality of magnetic fields, each adjacent a different one of said target regions, in accordance with parameter values associated with the respective region, to cause the emission of sputtered material from the respective target region when said target is energized; and
energizing said target in synchronism with the activation of the magnetic fields and in accordance with parameter values associated with the respective target regions.

99. The method of claim 98 wherein further comprising the step of regulating at least one of said electrical parameter values in synchronism with the activation of the magnetic fields.

100. The method of claim 98 wherein the electrical parameters include:
the current delivered to said electromagnets;
the current and voltage applied to said target when said target is energized; and
the time period during which the respective magnetic fields are activated.

101. The method of claim 98 further comprising the step of controlling the duty cycle of said energizing step to control the relative amounts of material sputtered from said regions.

102. The method of claim 98 wherein said geometric relationships include the distances separating each increment of the target surface within each region from each increment of the substrate surface visible therefrom, and the angles of each such substrate surface increment with respect to each target surface increment.

103. The method of claim 98 wherein said regions include an inner annular region surrounding the center of said target and an outer annular region surrounding said inner annular region.

104. The method of claim 103 wherein said target has:
an annular shape facing and parallel to the substrate and concentric therewith, a circular inner edge and a circular outer edge,
a diameter larger than that of the substrate, and
a sputtering surface facing the substrate which has a generally overall concave shape whereby said outer edge lies closer to the plane of said substrate than does the interior of said target surface and said inner edge; and
said sputtering surface has a continuous and smooth cross section along the radius thereof between said inner and outer edges.

105. The method of claim 104 wherein said target is thicker at said outer edge than at said inner edge and includes more sputtering material underlying said outer region than underlying said inner region.

106. The method of claim 105 wherein said magnetic fields are each activated by separately actuable electromagnetics.

107. The method of claim 106 wherein said electromagnets include a common pole piece underlying said target between adjacent regions.

108. The method of claim 107 wherein said target has a back surface opposite said sputtering surface and said pole piece is imbedded in said back surface near and behind said sputtering surface.

109. The method of claim 108 wherein said pole piece functions to structurally reinforce said target and to cooperate in restraining said target against thermal expansion.

110. The method of claim 108 wherein said pole piece includes cooling means for removing operational heat from said target.

111. The method of claim 103 wherein the substrate surface has steps thereon having outwardly facing sides and said sputtering surface of said target in said outer region includes increments of target surface approximately facing the outwardly facing sides of the steps on the surface of the substrate.

112. The method of claim 98 wherein said sputtering surface contains no increment in said regions which is not concave and continuous.

113. The method of claim 98 further comprising:
measuring a parameter of said target in synchronism with the activation of the magnetic fields to determine changes in parameters associated with change in said geometric relationship between the target region adjacent the activated field and the substrate surface;
changing the value of at least one of said electrical parameters to a revised value in response to said measuring step, said changed values being selected to cooperate with said changed geometric relationships so that the deposition of the sum of material sputtered from all of said regions is of said desired distribution across the substrate surface;
repeating said activating and energizing steps in accordance with said changed electrical parameter values.

114. The method of claim 113 wherein said measured parameters are related to the power consumption of said target.

115. The method of claim 113 wherein the measured parameter is related to the power consumption of said target.

116. The method of claim 113 wherein said measuring step comprises the step of measuring the rate of deposition onto the substrate.

117. The method of claim 98 further comprising the step of measuring the surface depth at a portion of said sputtering surface.

118. The method of claim 117 wherein said measuring step monitors the erosion of said target.

119. The method of claim 98 further comprising the step of repeatedly alternating the activation of said magnetic fields and repeatedly energizing said target in synchronism therewith.

120. The method of claim 98 wherein the activating of said magnetic fields at no time occur simultaneously.

* * * * *

UNITED STATES PATENT AND TRADEMARK OFFICE
CERTIFICATE OF CORRECTION

PATENT NO. : 4,957,605

DATED : September 18, 1990

INVENTOR(S) : Hurwitt et al.

It is certified that error appears in the above-identified patent and that said Letters Patent is hereby corrected as shown below:

Column 2, line 13, "58-71569" should be -- 58-171569 --

Column 8, line 58, "2!" should be -- 21 --

Column 10, line 14, "4" should be --42 --

Column 11, line 50, "47" should be -- 47' --

Column 21, line 40, "411" should be --41 --

Column 29, line 11, "the" should be -- to --

Column 31, line 62, "al" should be -- all --

Column 32, line 42, "on" should be -- one --

Column 32, line 49, after "field" insert -- . --

Column 34, line 19, "actuable" should be -- actuatable --

Signed and Sealed this

Second Day of March, 1993

*Attest:*

STEPHEN G. KUNIN

*Attesting Officer*   Acting Commissioner of Patents and Trademarks